(12) United States Patent
Shiode et al.

(10) Patent No.: US 6,633,390 B2
(45) Date of Patent: Oct. 14, 2003

(54) FOCUS MEASUREMENT IN PROJECTION EXPOSURE APPARATUS

(75) Inventors: Yoshihiro Shiode, Utsunomiya (JP); Izumi Tsukamoto, Setagaya-ku (JP); Hiroshi Morohoshi, Utsunomiya (JP); Yoshio Kawanobe, Utsunomiya (JP)

(73) Assignee: Canon Kabushiki Kaisha, Tokyo (JP)

(*) Notice: Subject to any disclaimer, the term of this patent is extended or adjusted under 35 U.S.C. 154(b) by 105 days.

(21) Appl. No.: 09/811,420

(22) Filed: Mar. 20, 2001

(65) Prior Publication Data

US 2002/0015158 A1 Feb. 7, 2002

(30) Foreign Application Priority Data

Mar. 21, 2000 (JP) .......................... 2000-078078
Jan. 18, 2001 (JP) .......................... 2001-010031
Feb. 16, 2001 (JP) .......................... 2001-040327

(51) Int. Cl.$^7$ .......................... G01B 11/00; G01N 21/86
(52) U.S. Cl. .......................... 356/620; 356/622; 356/624; 356/399; 356/400; 356/401; 250/548; 250/559.29; 250/559.3; 250/201.2; 250/201.4; 250/355; 250/53; 250/67
(58) Field of Search .......................... 356/614, 622, 356/620, 624, 399, 400, 401; 250/548, 559.29, 559.3, 201.2, 201.4; 355/53, 67, 77

(56) References Cited

U.S. PATENT DOCUMENTS

| | | | |
|---|---|---|---|
| 5,483,056 A | * | 1/1996 | Imai .......................... 250/201.4 |
| 5,674,650 A | * | 10/1997 | Dirksen et al. .............. 356/401 |
| 5,883,932 A | | 3/1999 | Chiba et al. .................. 378/34 |
| 5,999,589 A | | 12/1999 | Chiba et al. .................. 378/34 |

FOREIGN PATENT DOCUMENTS

| | | |
|---|---|---|
| JP | 7-130637 | 5/1995 |
| JP | 2748181 | 2/1998 |

* cited by examiner

*Primary Examiner*—Evelyn Lester
(74) *Attorney, Agent, or Firm*—Fitzpatrick, Cella, Harper & Scinto

(57) ABSTRACT

A method of detecting focus information about an image projecting optical system includes performing mark projection through the optical system, and, based on illumination lights having different chief ray incidence directions, the mark projection is carried out so that mark images formed by the illumination lights, respectively, are superposed one upon another approximately upon an imaging plane, and detecting focus information about the optical system on the basis of information related to a deviation between the mark images superposed.

48 Claims, 27 Drawing Sheets

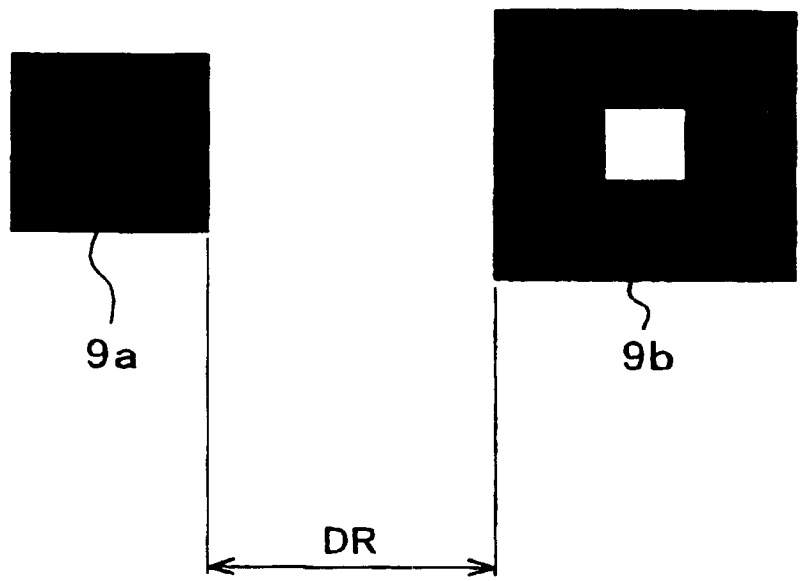
FIG. 2
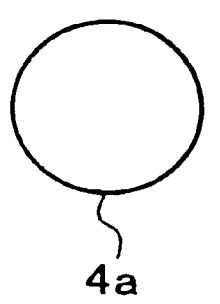 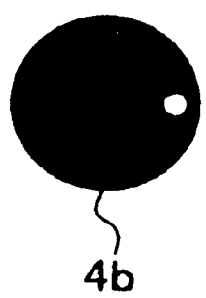 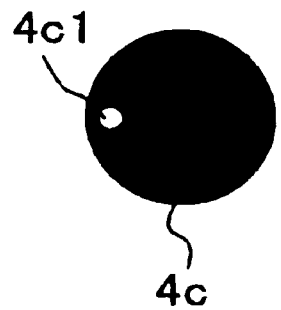 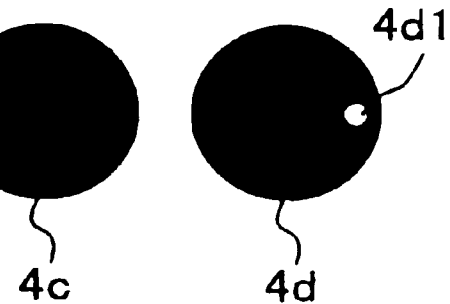
FIG. 3A  FIG. 3B

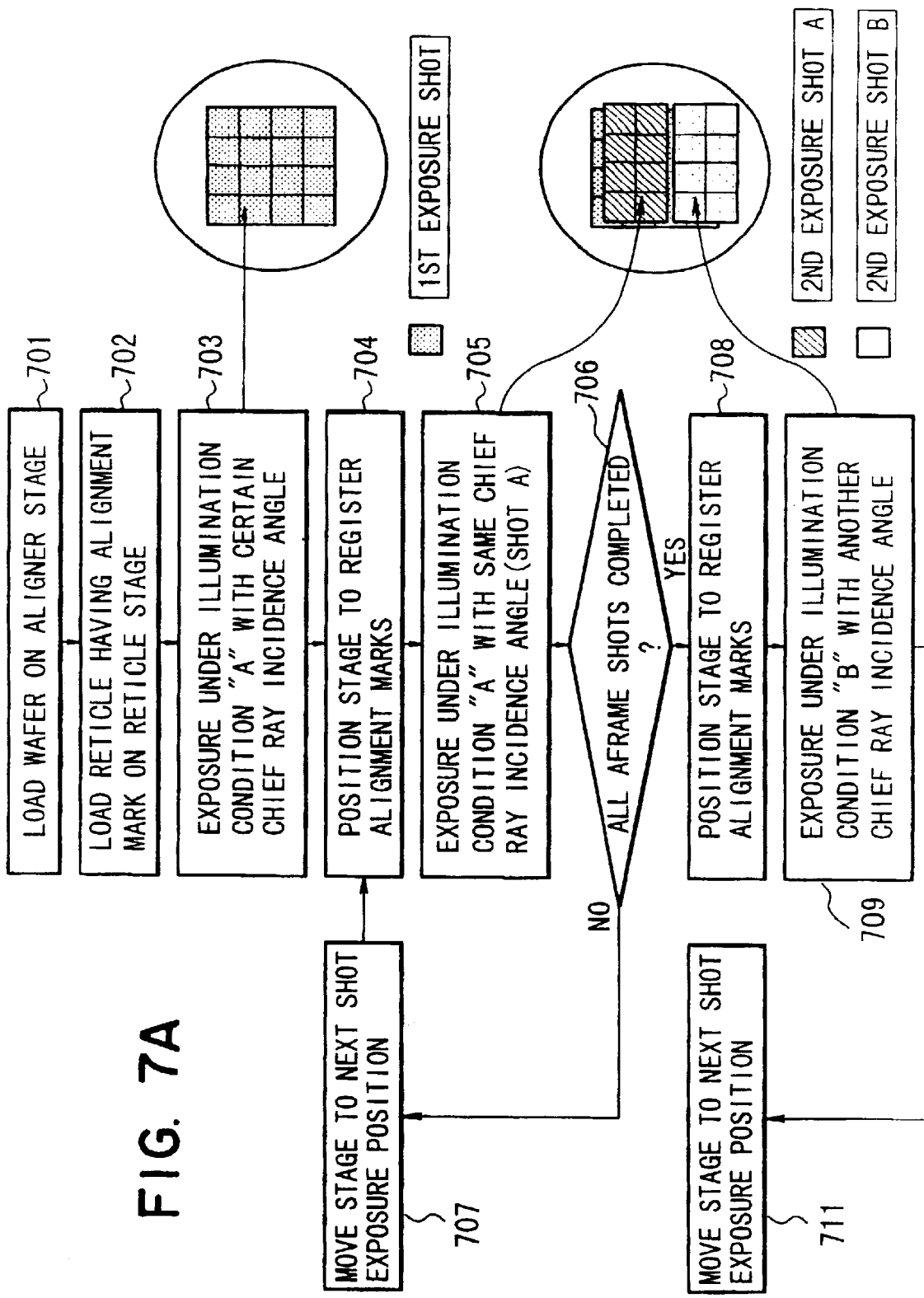

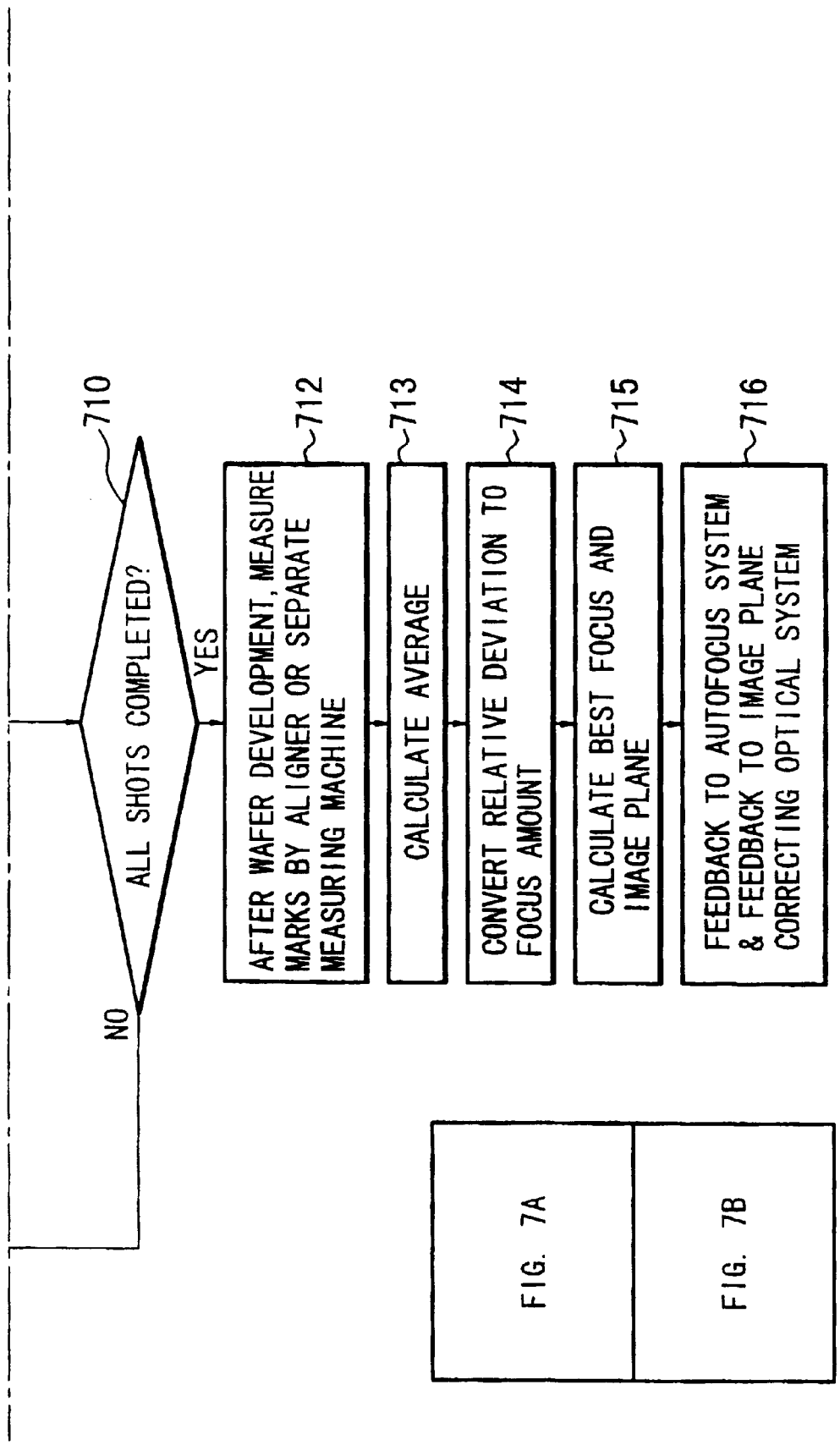

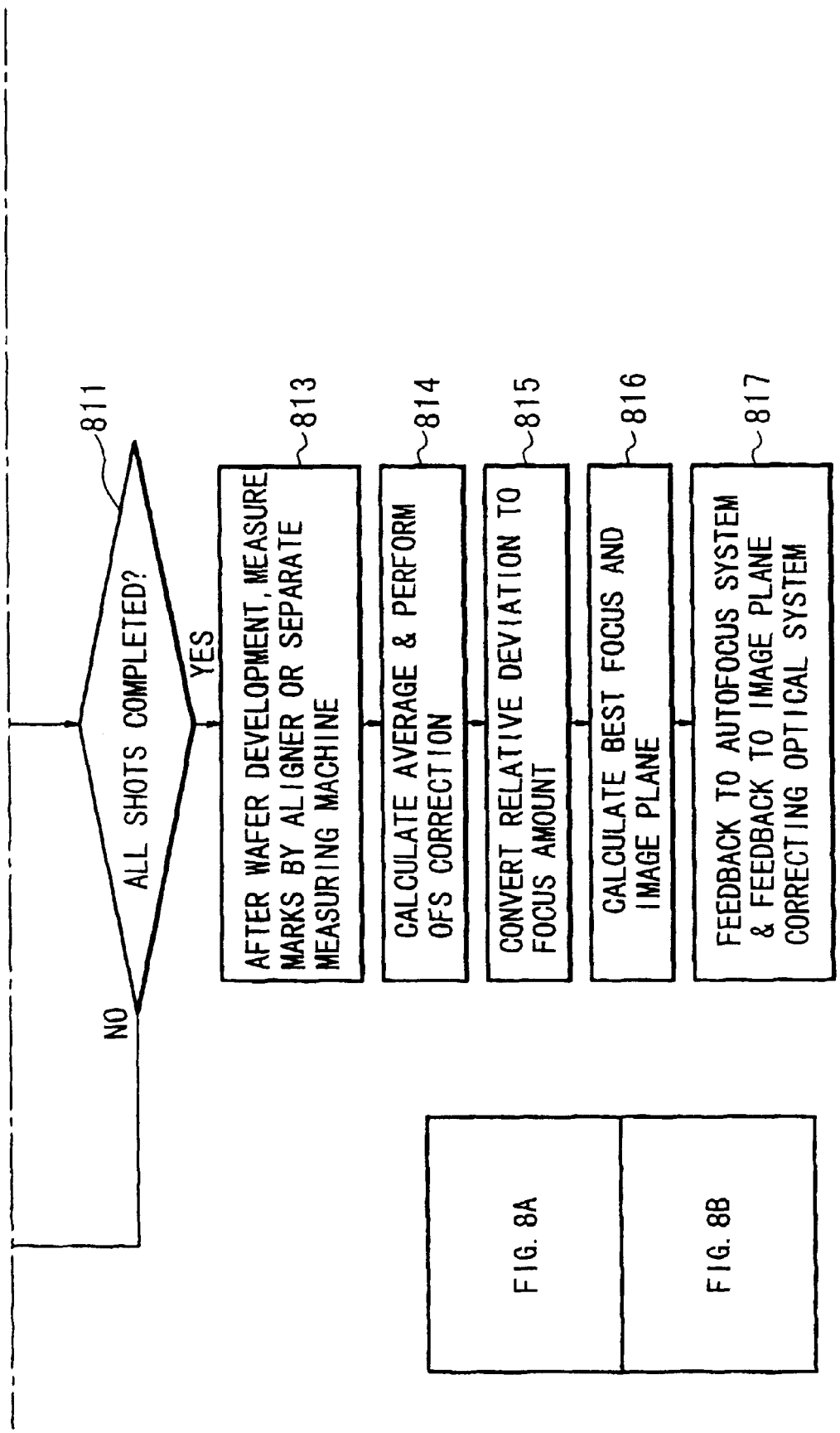

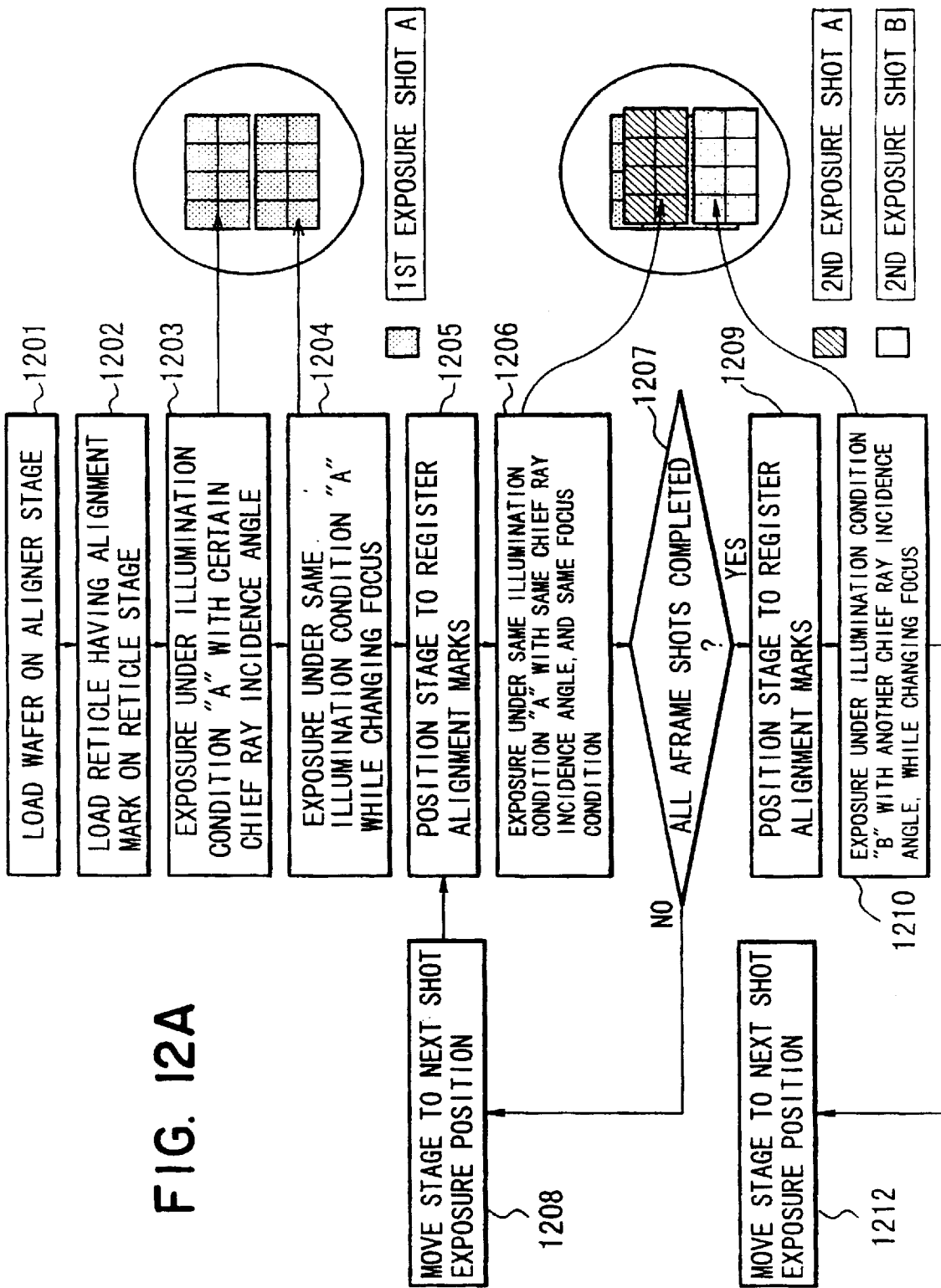

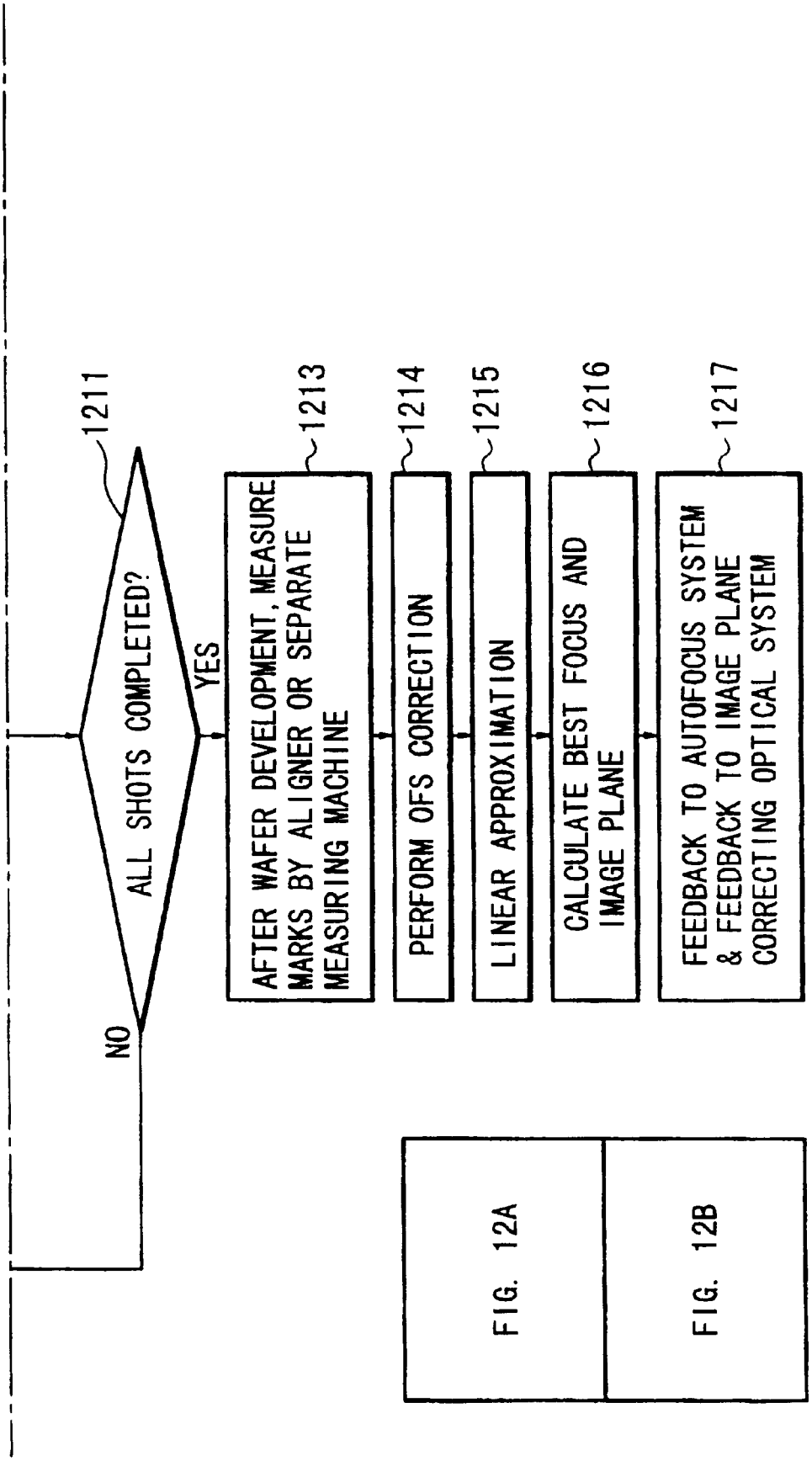

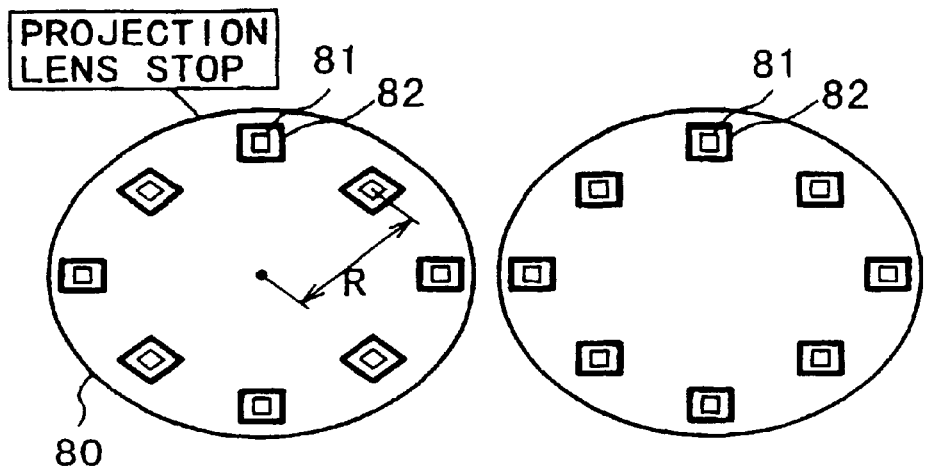
FIG. 19A
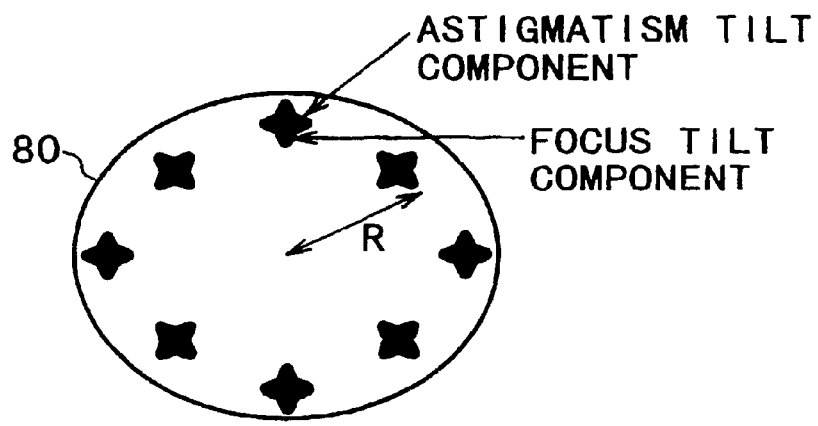
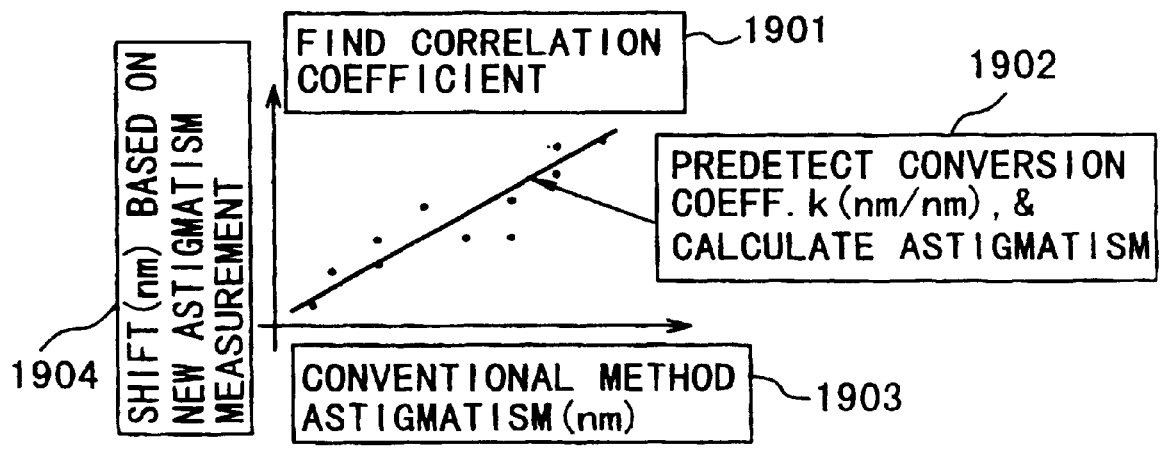
FIG. 19B

FOCUS MEASUREMENT IN PROJECTION EXPOSURE APPARATUS

FIELD OF THE INVENTION AND RELATED ART

This invention relates to a measurement method or an imaging position detecting method for detecting a best focus position, a best image plane or an astigmatism aberration of an optical system, for example. The present invention is particularly suitably usable for detecting an optical characteristic of a projection optical system in a projection exposure apparatus used in a lithographic process for the manufacture of semiconductor devices, liquid crystal display devices or thin film magnetic heads, for example.

The manufacture of semiconductor devices, liquid crystal display devices, or thin film magnetic heads, for example, based on a lithographic process uses a projection exposure apparatus for forming an image of a pattern of a photomask or reticle (hereinafter, simply "reticle") on a photosensitive substrate through a projection optical system. In such a projection exposure apparatus, in order that the reticle pattern is printed on the photosensitive substrate with a high resolution, the exposure process should be carried out while the photosensitive substrate is registered with the best imaging plane (best focus plane) of the projection optical system, within the tolerance of the depth of focus. To this end, by using any method, the best focus plane of the projection optical system, that is, the best focus position thereof has to be detected. However, in practical projection optical systems, there are various aberrations involved. Particularly, if there is astigmatism, the best focus position then differs with the direction of advancement of light diffracted by the pattern. Further, a projection optical system has a best focus image plane in which the best focus position differs with the image height.

In consideration of the above, in conventional measuring methods for measuring the best focus position or astigmatism of a projection optical system, exposures are made while successively changing the position of a photosensitive substrate with respect to the optical axis direction of the projection optical system and CD changes of resist images formed on the surface of the photosensitive substrate at different positions are measured. Alternatively, changes of contrast of an aerial image of a pattern formed by the projection optical system at different image heights are measured to determine the best focus position, to thereby measure the image plane. As a further alternative, the difference in best focus position of a pattern with respect to two different directions of sagittal direction and meridional direction is detected.

There is a further method in which a line pattern is formed on a reticle by use of chromium (light blocking material), with glass portions (light transmitting portion) defined on the opposite sides of the line pattern. A pattern having different phases of 90 deg. and 0 deg. is used in the light transmitting portion, such that, on the basis of a positional deviation resulting from distortion of imaging due to defocus, the best focus as well as a difference in best focus between two orthogonal directions is detected, from the relation between the positional deviation and the focus. The image plane is measured in this manner.

These conventional measurement methods involve difficulties in quantization of the measurement results and, thus, difficulties in performing high precision measurement.

For simplification of the quantization, there is a method for detecting the best focus position in accordance with the relation between the focus and the spacing of projected images formed at different positions of the same pattern or different patterns, being illuminated at different chief ray incidence angles and being projected.

Even with such a quantization-simplified method, there are difficulties in accomplishing high precision measurement. This is because, in such a method, projected pattern images must be formed at different positions and, therefore, as the spacing between the projected pattern images becomes large, the detection error necessarily becomes large. In order to make the image spacing smaller, the projected pattern image itself, that is, the original pattern itself, has to be made smaller. The work precision is then insufficient.

On the other hand, this method is limited to the best focus position measurement. It is not applied to quantization for the image plane measurement or astigmatism measurement.

Further, in the measurement, not only the mask, but also the illumination system has to be manipulated specifically.

SUMMARY OF THE INVENTION

It is accordingly an object of the present invention to provide a measurement method and/or a projection exposure apparatus using the same, by which focus information can be measured conveniently and very precisely.

It is another object of the present invention to provide a measurement method and/or a projection exposure apparatus using the same, by which convenient and high precision quantization can be accomplished in the measurement of an image plane.

It is a further object of the present invention to provide a mask which is suitably usable with the measurement method such as described above and by which the necessity of special manipulation of an illumination system is removed in principle.

It is a yet further object of the present invention to provide a measurement method by which astigmatism at different image heights of a projection optical system can be detected quickly and very precisely.

It is a still further object of the present invention to provide a measurement method and an exposure apparatus using the same, by which an imaging position characteristic of a projection optical system, for example, can be measured very precisely.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 2 is a plan view of marks provided on a reticle, in the first embodiment of the present invention.

FIGS. 3A and 3B are schematic views, respectively, of illumination system aperture stops used in the first embodiment and second embodiment of the present invention.

FIG. 7 is a flow chart of a control sequence, being partially modified.

FIG. 12 is a flow chart of a control sequence usable in the fifth to seventh embodiments of the present invention.

FIGS. 19A and 19B are schematic views, respectively, for explaining a pupil plane of a projection lens, in the measurement method of the present invention.

DESCRIPTION OF THE PREFERRED EMBODIMENTS

Referring now to FIGS. 1–14, an embodiment of a measurement method for measuring the position of a best focus plane of a projection optical system according to the present invention will be described.

Figure 1:
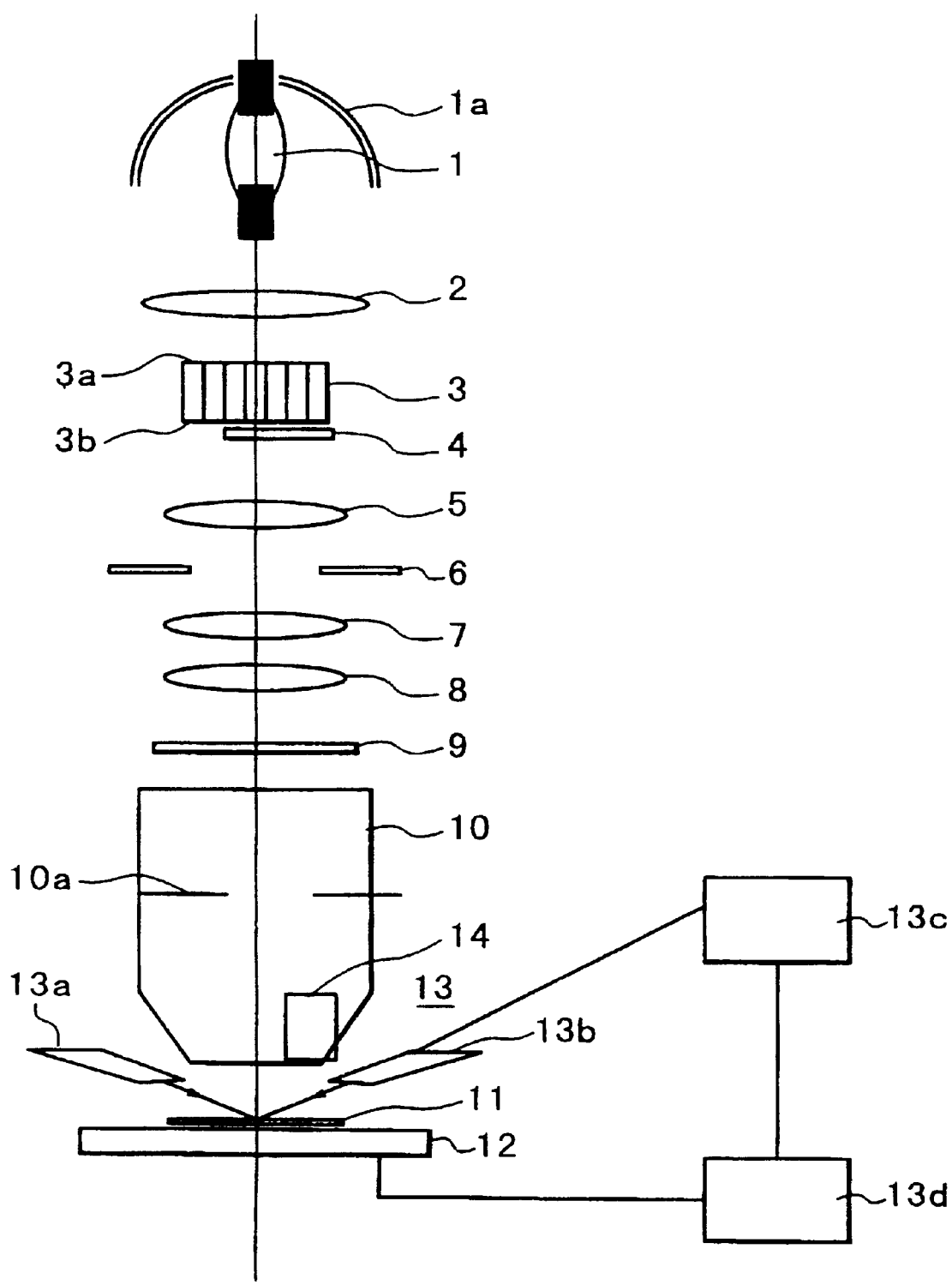
FIG. 1 is a schematic view of a projection exposure apparatus according to a first embodiment of the present invention.

Referring to FIGS. 1 and 2, the basic structure of a projection exposure apparatus will be explained. In this embodiment, the invention is applied to measurement of the position of a best focus plane of a projection optical system in a projection exposure apparatus. Here, it should be noted that, while in the embodiments to be described below, the present invention is applied to a projection exposure apparatus which is based on lens projection, the present invention is applicable also to a projection exposure apparatus based on mirror projection or the combination of lens projection and mirror projection.

FIG. 1 schematically shows the general structure of a projection exposure apparatus according to this embodiment. Denoted in FIG. 1 at 1 is a light source for emitting exposure light, and it comprises a high-pressure Hg lamp or an excimer laser, for example. When a high-pressure Hg lamp is used, the exposure light emitted from the light source 1 is collected by an elliptical mirror 1a and, after this, the light is projected through an input lens 2 to the light entrance surface 1a of a fly's eye lens 3. A number of secondary light sources are formed at the rear (reticle side) focal plane, close to the light exit surface 3b of the fly's eye lens 3. Exposure light rays emitted from these secondary light sources advance via an aperture stop 4, a first relay lens 5, a projection type reticle blind 6, a second relay lens 7, and a main condenser lens 8, and they illuminate a reticle 9 with approximately uniform illuminance. The projection type reticle blind 6 and the pattern bearing surface of the reticle 9 are placed in an optically conjugate relation, such that, with this reticle blind, an illumination region is defined on the reticle 9.

The aperture stop 4 is arranged so that, in response to a switching operation, one of aperture stops 4a and 4b shown in FIG. 3A is selectively set Alternatively, it is so arranged that an aperture of a desired size is defined at a desired position.

With the exposure light, an image of the pattern formed on the pattern bearing surface of the reticle is transferred, through a projection optical system 10, onto the surface (surface to be exposed) of a wafer 11 placed on a wafer stage 12. The rear focal plane of the fly's eye lens 3 is placed approximately conjugate with the pupil plane of the projection optical system 10. Although details are omitted, the wafer stage 12 comprises an X-Y stage having a function for positioning the wafer 11 at a desired position in a plane perpendicular to the optical axis of the projection optical system 10, and a Z stage for setting the position of the wafer 11 surface with respect to a direction parallel to the optical axis of the projection optical system 10, namely, the focus position, for example.

In this embodiment, there is an autofocusing system 13 for detecting the focus position of the wafer 11 surface. The autofocusing system 13 comprises a light sending system 13a for projecting an image of a slit-like detection pattern, for example, onto the surface of the wafer 11, obliquely with respect to the optical axis of the projection optical system 10, and a light receiving system 13b for receiving reflection light from the wafer surface and for re-imaging the image of the detection pattern. If the focus position (height position) of the wafer 11 surface changes, the position of the image of the re-imaged detection pattern changes. Thus, by detecting the image position, a change in the focus position can be detected. The light receiving system includes a photoelectric detector 13c for producing a focus signal which is changeable with the position of the re-imaged detected pattern. A control system 13d operates to move a Z stage of the wafer stage 12 so that the focus signal is maintained at a predetermined level, by which the focus position of the wafer surface can De held at a predetermined position (focus state).

Since the focus signal changes approximately linearly with a change in the focus position within a predetermined range, a change in focus position can be detected, on the other hand, on the basis of a change in level of the focus signal. Further, the Z stage of the wafer stage 12 is provided with a height sensor (not shown) for detecting the position of the Z stage in the optical axis direction of the projection optical system.

Denoted at 14 is an off-axis wafer alignment system for detecting positional information of the wafer 11. Since the structure thereof is well known in the art, details are not illustrated. The wafer alignment system 14 serves to detect alignment marks formed on adjacent shot regions of the wafer 11.

In this case, if the spacing between the detection center of the wafer alignment system 14 and a conjugate image of the center of the reticle 9, namely, the baseline length, is predetected, each shot region of the wafer 11 can be aligned very accurately on the basis of the position of the alignment marks as measured by the wafer alignment system 14. Further, the wafer alignment system 14 may be used for detection of various marks.

FIG. 2 is an enlarged view of a portion of the reticle 9 in FIG. 1. Specifically, FIG. 2 illustrates rectangular marks 9a and 9b of different sizes, which are formed on the pattern bearing surface at the bottom side (projection optical system 10 side) of the reticle 9, with a spacing DR.

The measurement method in this embodiment will be described.

The position of the aperture of the aperture stop 4a or 4b corresponds to the angle (NA) of light impinging on the wafer surface. Therefore, if the position of the aperture is spaced away from the light path, the incidence angle becomes larger and also the amount of lateral shift to defocus (Z) becomes larger. Thus, the resolution increases. Also, if the size of the aperture is made larger, the influence of aberration can be reduced, and an average image plane position can be determined. In order to obtain the lateral shift amount, it is necessary to obtain the distance between two patterns. To this end, by using the aperture stop 4a, marks 9a and 9b are photoprinted on a dummy wafer. Subsequently, in order that a latent image of the mark 9a printed on the wafer and the projected image of the mark 9b, or alternatively, the projected image of the mark 9a and the latent image of the mark 9b are superposed with each other with their centers completely registered with each other, under the best focus state, the wafer stage is moved along the mark array direction by DRX projection magnification, and the aperture stop is changed to the aperture stop 4b and an exposure process is made.

After the dummy wafer is developed, the amount of relative positional deviation between the marks 9a and 9b formed by the exposure is measured by using an alignment mark detecting system of the projection exposure apparatus or an optical microscope outside the exposure apparatus, for example. Here, if the marks are printed at the best focus plane, the amount of shift between the centers of the marks is zero, such that the focus deviation can be expressed as the shift amount itself (a value proportional thereto). In this example, since there is substantially no shift change due to the focus by the aperture stop 4a, the focus change by the stop 4b can be observed.

If the wafer flatness is sufficiently small and the wafer is flat, as long as the shift amount with respect to the focus, namely, a change in positional deviation with the focus (hereinafter, "sensitivity") is predetected, the difference in shift at various image heights inside a single shot can be converted into a difference of focus, such that an image plane can be determined. Further, if the sensitivity is stably constant independently of the image height and the shift amount is within the focus range in which it changes linearly relative to the focus, the detected image plane is not influenced by a detection error of the autofocusing system or an error in Z drive. Thus, a major error factor is the wafer flatness only. Therefore, if the above-described superposed printing is made to plural shots on a dummy water and the measurement is done to the shots after development, the error of flatness is averaged by an amount corresponding to the increase in the number of shots and, thus, the precision increases.

Specifically, since this embodiment is arranged so that the images of the marks projected with their chief rays of illumination light projected with different incidence directions are inherently superposed with each other, the spacing between the center positions of them is made inherently small, regardless of the mark size. Therefore, the measurement method of this embodiment for performing the measurement on the basis of the deviation between them involves only a small error, in principle. Namely, if the measurement is made by use of an apparatus in which an error of 0.1% in the measured value is inevitable, the error becomes small since the measured value to be obtained is inherently small. Further, since there is no necessity of making the mark extraordinarily small, there is no possibility of a large error in the shape of the mark.

A second embodiment will be described below. Since the second embodiment is similar to the first embodiment except for the aperture stop, description and illustration of the remaining portion of the second embodiment will be omitted. Further, in all embodiments to be described below, duplicate description and illustration will be omitted, similarly.

If a projection exposure apparatus having a large influence of coma aberration is used with the combination of aperture stops of the preceding embodiment, there are cases wherein, due to the influence of the coma aberration, an offset occurs in the focus shift amount. In order to cancel this and to obtain a focus resolution two times higher, in the second embodiment, a combination of aperture stops 4c and 4d shown in FIG. 3B is used to perform an exposure process similar to the preceding embodiment. These aperture stops 4c and 4d are placed in a symmetric relation with respect to the optical axis of the illumination optical system, such that all the components as can be expressed by an odd function of lens aberration are cancelled. Also, since even function components appear with a double sensitivity, the resolution for the best focus position measurement can be increased twice.

It is known that the best focus changes due to spherical aberration. In such a case, a difference in spherical aberration inside the image height causes a change in image plane. Usually, there are various means for determining the best focus, and values are different with such means or conditions. It is, therefore, desirable to determine an image plane (best focus) which is less influenced by the means or conditions. Here, the best focus is defined as a Gaussian image plane (paraxial image plane), and a description will be made of the best focus measurement method less influenced by the spherical aberration, particularly, about the portion different from the preceding embodiment.

Figure 4:
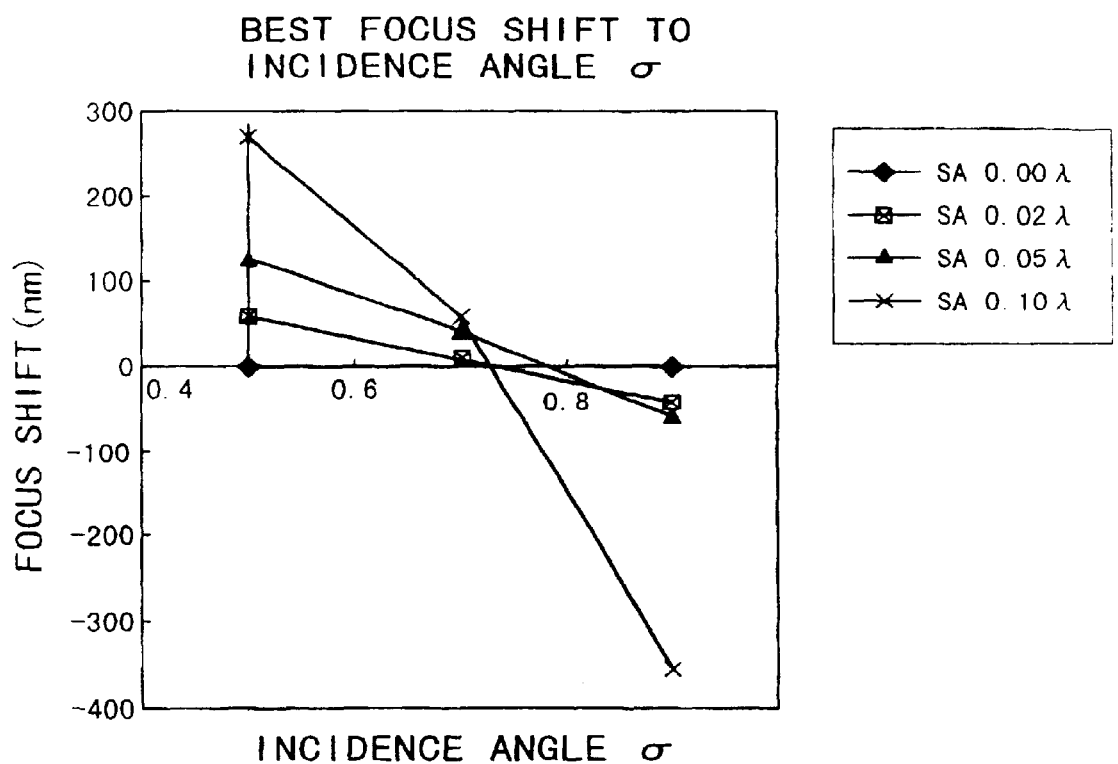
FIG. 4 is a graph for explaining a shift of the best focus due to a difference in tilt angle of the chief ray, in a case where spherical aberration is produced.

FIG. 4 illustrates a shift of best focus (from a Gaussian image plane), depending on the difference in tilt angle of the chief ray, in a case wherein a lowest-order spherical aberration is produced, in the second embodiment. If the marks 9a and 9b are sufficiently large with respect to the exposure wavelength, diffraction light from the mark 9a or 9b illuminated with the aperture stop 4c is not generally expanded, and it reaches a certain small region on the pupil plane of the projection exposure system 10, at the tilt angle of the chief ray. It is influenced by the wavefront aberration of the projection lens (here, the wavefront aberration consisting only of spherical aberration components), corresponding to the certain small region of the pupil plane, and there occurs a lateral shift of the imaging position 11 of the mark 9a or 9b, corresponding t the tilt of that wavefront.

Further, similarly to the preceding embodiment, the stage is moved so that the latent image of the mark 9a and the projected image of the mark 9b are superposed one upon another, and, by using the aperture stop 4b, a second exposure is performed. Similarly to what has been described above, the diffraction light from the mark 9a or 9b reaches a certain small region on the pupil plane of the projection exposure system 10, with the tilt angle of the chief ray. It is influenced by the wavefront aberration of the projection lens 10 (here, the wavefront aberration only consisting of spherical aberration components), corresponding to the certain small region of the pupil plane, and there occurs a lateral shift of the imaging position 11 of the mark 9a or 9b, corresponding to the tilt of that wavefront.

In this case, the position of the diffraction light on the pupil plane is axially symmetrical with respect to the position at the first exposure, and the tilts of the wavefronts comprising the spherical aberration components only are symmetrical with respect to the optical axis of the projection lens 10 and also they are equal to each other. Therefore, lateral shifts at the imaging position 11 of the marks 9a and 9b are produced in the opposite directions and by the same amount. Thus, when the relative positional deviation between the superposed marks 9a and 9b is measured after the development, even if the best focus state is accomplished, there is a positional deviation between the centers of these marks. Namely, there is a shift of best focus.

In order to reduce the influence of best focus shift due to the spherical aberration, it is necessary to measure the tilt of the wavefront due to the spherical aberration. The wavefront tilt changes with the position on the pupil plane. Generally, the position on the pupil plane is expressed while taking the NA of the projection exposure system as 1, and this value corresponds to a value obtainable by σ conversion of the tilt angle of the chief ray of the illumination light. Thus, by setting the position of the aperture of the aperture stop 4a or 4b at the position on the pupil plane where the tilt of the wavefront is flat, the influence of the best focus shift due to the spherical aberration can be reduced or prevented. The calculation formulae are given as follows:

$$\partial W(R)/\partial R = 0$$

$$W(R) = a(6R^4 6R^2 + 1) + b(20R^6 - 30R^4 + 12R^2 - 1) +$$
$$c(70R^8 - 140R^6 + 90R^4 - 20R^2 + 1) +$$
$$d(252R^{10} - 639R^8 + 560R^6 - 210R^4 + 302R^2 - 1) +$$
$$e(924R^{12} - 2772R^{10} + 3150R^8 - 1680R^6 + 420R^4 +$$
$$42R^2 + 1)$$

where W(R) is the spherical aberration function of the spherical aberration component, R is the pupil position of the projection exposure system, and a, b, c, d, and e are Zernik coefficients.

It is seen from this that, if the aperture stops 4c and 4d are set at positions on the pupil plane where the wavefront tilt is flat in average through all the image heights, the influence of the spherical aberration to the image plane can be reduced.

Further, if the wavefront aberration at different image heights is predetected, from the equation below, an image plane where, for each image height, the best focus shift due to the spherical aberration is corrected, can be calculated.

$$Fc = k \cdot \partial W(Ro)/\partial R$$

where Fc is the best focus correction amount, k is the focus sensitivity coefficient, and Ro is a value obtainable by σ conversion of the tilt angle of the chief ray of the illumination light.

It should be noted that, since in this embodiment the image plane (best focus position distribution) is to be detected, the reticle used differs from the preceding embodiment as follows.

Namely, on the pattern bearing surface (bottom face) of the reticle 9, a plurality of rectangular marks 9a and 9b are arrayed alternately with intervals DR. There are plural arrays each being such as above, which are disposed along a direction perpendicular to the direction of each array, such that rectangular marks 9a and 9b are provided two-dimensionally on the reticle surface. As regards the superposed printing, after the first time exposure, the stage is moved in the array direction with the spacing DR, by an amount corresponding to the DRX projection magnification, and then the second time exposure is performed. The aperture stops 4c and 4d are interchanged therefor, as in the preceding embodiment.

When the reticle such as described above is used and the best focus position measuring method of the preceding embodiment is performed with respect to each mark position, image plane data can be produced as a distribution of best focus positions at each of the image height positions (two mark forming positions when viewed macroscopically, and more strictly, center positions of two marks on the reticle as superposed one upon another on a dummy wafer).

Next, a fourth embodiment in which, without changing aperture stops, a single aperture stop having a large aperture is used to perform the measurement, will be described.

In this embodiment, a mask (reticle) such as shown in FIGS. 5A and 5B is used to measure the image plane. The mask has an ordinary chromium surface on which marks 15a and 15b (FIG. 5A) are formed with placement as those of the first or third embodiment. Here, this will be explained as an image plane measuring mask, as in the third embodiment. Further, on the surface opposite to these marks 15a and 15b (which is usually a glass surface), there are openings or holes 15c and 15d defined by chromium or a material effective to block the exposure light. FIG. 5b schematically illustrates the sectional view of this mask.

The opening 15c functions to restrict the tilt angle of light rays of the illumination light impinging on the mark 15a, while the opening 15d functions to restrict that of light impinging on the mark 15b. In order that illumination light is projected at different tilt angles of chief rays of the light having restricted tilt angles or that the illumination light is projected with the chief rays having the same tilt angle and with the incidence directions being symmetric with respect to the light incidence surface, the openings are formed under the following condition:

$$s=(NA_{u1} \cdot \sigma a \cdot t/m)/n$$

$$q=(NA_{u1} \cdot \tau \cdot \sigma b/m)/n$$

where s is the distance between the mark 15a and the opening 15c, or between the mark 15b and the opening 15d, $NA_{u1}$ is the numerical aperture of the projection lens, σa is the σ value of the chief ray with a tilt angle of the illumination light restricted by the opening 15c or 15d, t is the glass thickness of the mask, q is the diameter of the opening 15c or 15d, σb is the value obtainable by σ conversion of the width of the tilt angle of the illumination light to be restricted, m is the reduction magnification of the projection optical system, and n is the refractive index as determined by the mask material.

Further, the illumination light of the projectable tilt angle which is determined by the positional relation between the opening 15c and the mark 15b or between the opening 15d and the mark 15a should be intercepted by the aperture stop 5 of the illumination system. Alternatively, the positional relation between the marks 15a and 15b and the openings 15c and 15d should be defined so as to satisfy the following equation:

$$p \geq NA_{u1} \cdot t \cdot (\sigma o - \sigma a)/m$$

where p is the distance between the marks 15a and 15b, and σo is the σ value of the aperture stop 4 of the illumination system.

Figure 5:
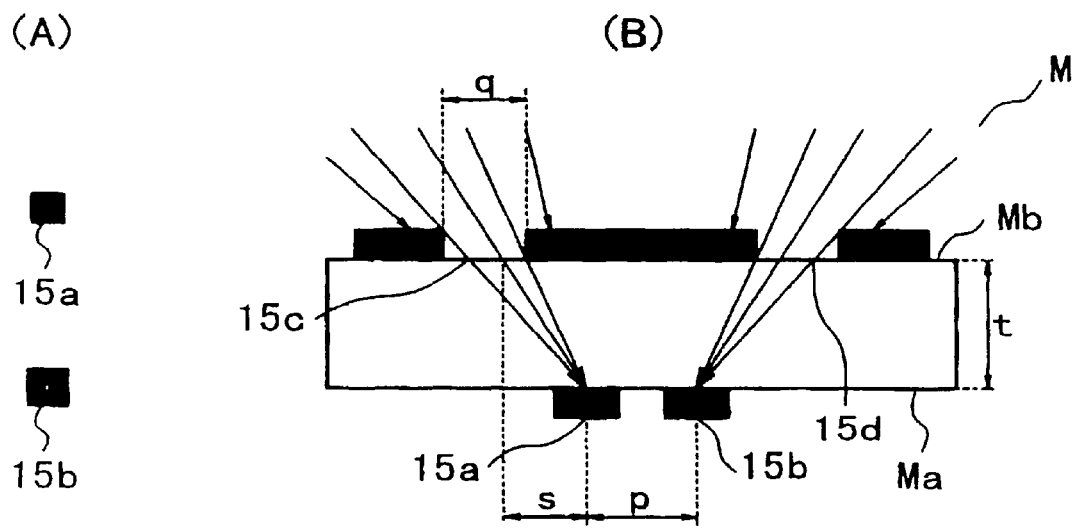
FIG. 5 is enlarged and schematic views for explaining a reticle in a third embodiment of the present invention.

The mask such as shown in FIG. 5 is used, and marks 15a and 15b are photoprinted on a dummy wafer through a single exposure, like the preceding embodiment. After this, the stage is moved so that the latent image of the mark 15a and the projected image of the mark 15b (alternatively, the projected image of the mark 15a and the latent image of mark 15b) are superposed one upon another. Then, by using the same aperture stop 5, marks 15a and 15b are photoprinted again. After the development, the amount of relative positional deviation between the marks 15a and 15b formed lithographically is measured on the basis of measured values. By forming a pair of marks 15a and 15b and corresponding openings 15c and 15d upon a mask, at each of the image heights, and by measuring, at each image height, the amount of relative positional deviation between marks 15a and 15b superposed one upon another by the two exposures described above, the image plane can be measured. This method is free from the influence of a telecentricity error of the illumination system, and therefore, a higher precision is attainable.

Figure 6:
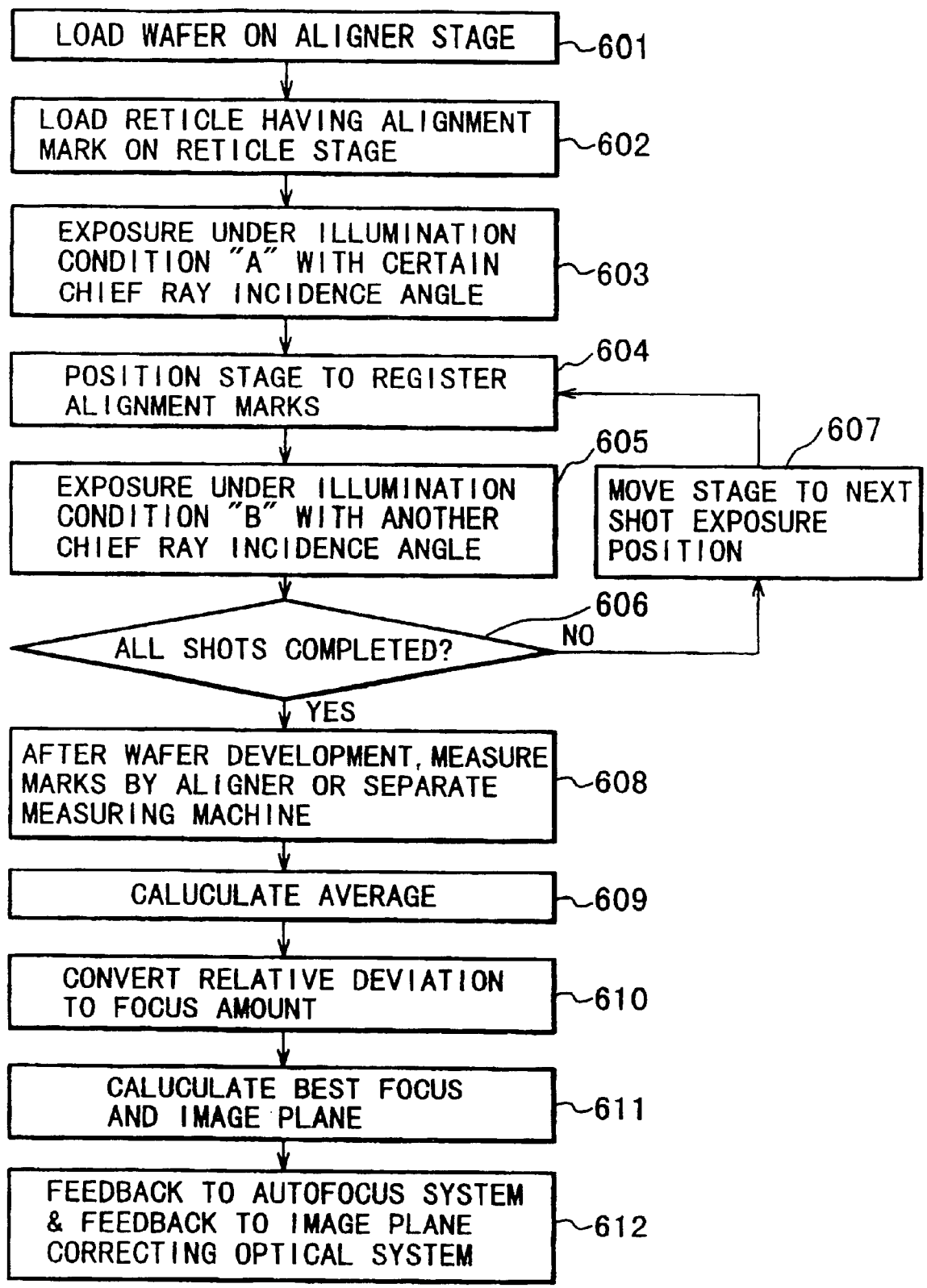
FIG. 6 is a flow chart of a control sequence usable in the first to fourth embodiments of the present invention.

FIG. 6 shows a control sequence of a control system (not shown) for performing the measurement and a correction procedure following it, in the projection exposure apparatus shown in FIG. 1, in accordance with the first to fourth embodiments described above.

The control system operates so that a photosensitive substrate (dummy wafer) and a reticle of the structure described above are loaded on stages by means of well-known conveyance systems, and then, the first time exposure, the wafer stage motion for mark registration, and the second time exposure are performed. Although this operation may be done only once, in this embodiment, for the averaging effect described above, after first time exposures are made sequentially to shot regions on the photosensitive substrate in the step-and-repeat method, the wafer stage motion for mark registration and the second time exposure are repeatedly done in each shot on the photosensitive substrate.

A development process for an exposed photosensitive substrate as well as mark measurement with the use of another measuring machine are performed by a separate system outside the exposure apparatus, or it is done manually by an operator. A central control system for controlling the factory as a whole may be used to control them together with other steps. On the other hand, if it is to be done in the mark detection system of the projection exposure apparatus itself, after the developed substrate is loaded on the stage (not shown), the mark measurement is carried out by use of the detecting system.

On the basis of the thus obtained measurement results, inside the control system and with respect to different image height points, an all-shot average value of the central position (deviation thereof) of the mark illuminated under the illumination condition A as well as an all-shot average value of the center position (deviation thereof) of the mark illuminated under the illumination condition B, are calculated. From the difference between them, an average mark deviation amount at each image height is obtainable. Each value is then converted into a focus amount, whereby the image plane of the projection optical system is calculated.

On the basis of the thus obtained image plane, an average focus position within the shot illumination range, for example, is determined and, based on it, the current offset value of the autofocusing system 13 is corrected. Further, a feedback is applied to an image plane correcting optical system (not shown) of the projection optical system, to perform the image plane correction.

FIG. 7 shows a modified example of the control sequence, in which the offset of the measuring system is taken into account. In FIG. 7, the layout of shots where exposures are to be done practically is illustrated at the right-hand side of the flow.

The procedure in the control system, in which a photosensitive substrate (dummy wafer) and a reticle of the structure described above are loaded on stages by means of well-known conveyance systems, is similar to the preceding control sequence. Subsequently, however, a plurality of separate frame shots other than those for the measurement are provided on the photosensitive substrate, and the first time exposures are sequentially made to the shots, including these separate frame shots, in the step-and-repeat method, without changing the focus position. Then, the stage is moved to the initial separate frame shot exposure position and, from this position, as regards the separate frame shots, the stage is moved so that the marks described above are registered with each other under the same illumination condition as the first time exposure (the same aperture stop in the first, second and third embodiments), and the second time exposures are made. This procedure is done in the step-and-repeat method, sequentially, to the separate frame shots.

In the fourth embodiment, a plurality of sets each comprising a pair of marks 15a and 15b such as shown in FIG. 5 and openings 15c and 15d corresponding to them, are arrayed in a row in the direction of the mark spacing DR. Also, in juxtaposition thereto, there are a plurality of sets each comprising marks 15a and 15b provided in a reverse disposition to the openings 15c and 15d, the sets being arrayed in a row in parallel to the first row. This structure is repeated in a direction perpendicular to the direction of the mark spacing DR. As regards the exposure of the separate frame shot the exposure may be done so that the centers of the projected images of different marks in adjacent rows and with the same illumination condition are registered with a latent image on the photosensitive substrate in the best focus state.

Subsequently, to the shots in which exposures have been made in the first time exposures while changing the focus position sequentially, the second time exposures with mark registration and an illumination condition different from the first time exposure, are made sequentially in the step-and-repeat method.

A development process for an exposed photosensitive substrate as well as mark measurement with the use of another measuring machine are performed by a separate system outside the exposure apparatus, or it is done manually by an operator. A central control system for controlling the factory as a whole may be used to control them together with other steps. On the other hand, if it is to be done in the mark detection system of the projection exposure apparatus itself, after the developed substrate is loaded on the stage (not shown), the mark measurement is carried out by use of the detecting system.

On the basis of the thus obtained measurement results, inside the control system and with respect to different image height points, an all-shot average value of the central position (deviation thereof) of the mark illuminated under the illumination condition A as well as an all-shot average value of the center position (deviation thereof) of the mark illuminated under the illumination condition B, are calculated. From the difference between them, an average mark deviation amount at each image height is obtainable. On the other hand, as regards the separate frame shots where superposed printing exposures have been made under the same illumination conditions, with respect to each of the image height points, an all-shot average value of the central position between the superposed marks at the separate frame shots which should inherently be registered with each other, is an offset value in this measurement system. With respect to each image height, this offset value is subtracted from the deviation average, and it is converted into a focus amount, by which the image plane of the projection optical system is calculated.

On the basis of the thus obtained image plane, an average focus position within the shot illumination range, for example, is determined and, based on it, the current offset value of the autofocusing system 13 is corrected. Further, a feedback is applied to an image plane correcting optical system (not shown) of the projection optical system, to perform the image plane correction.

Figure 8A:
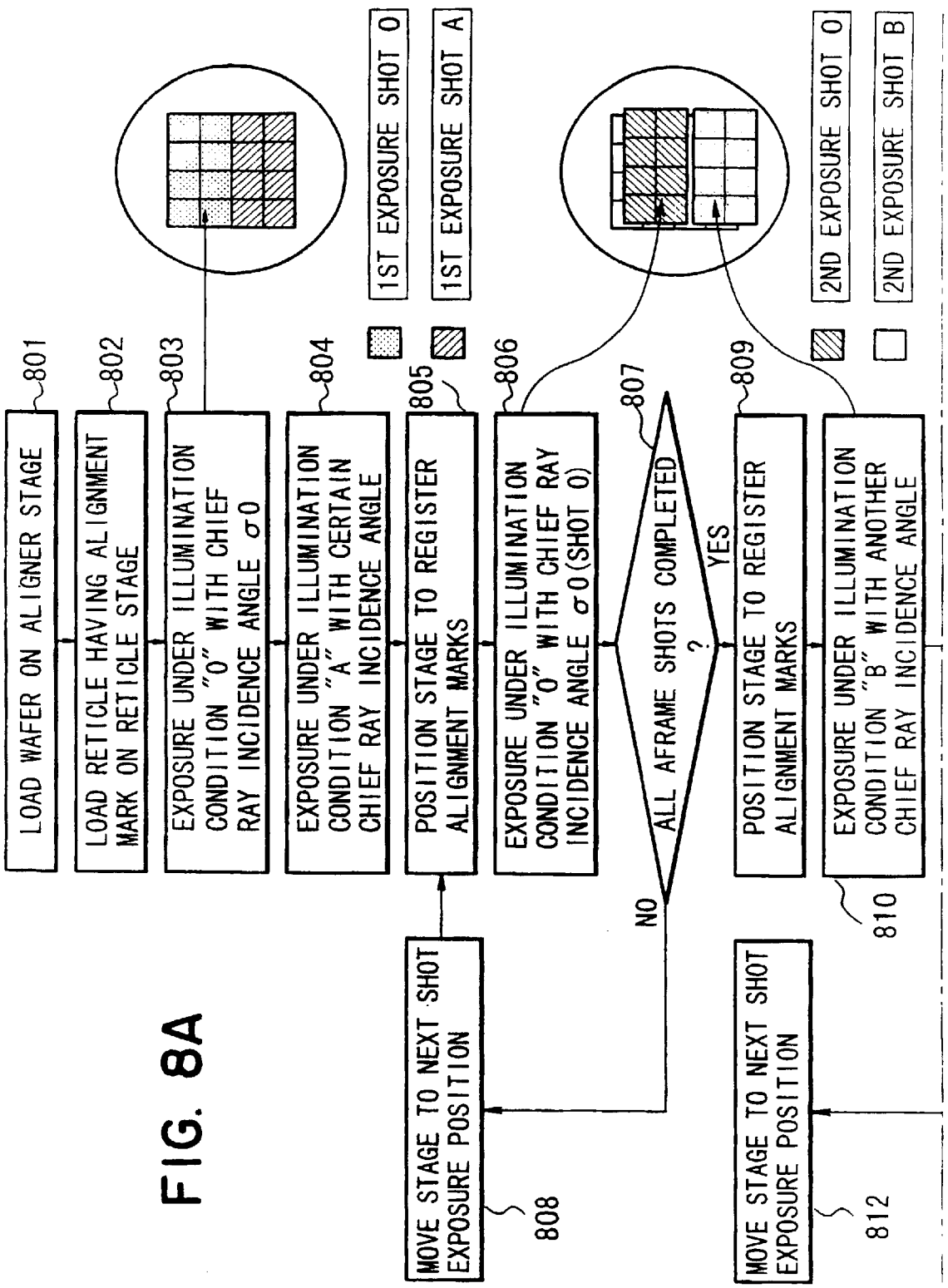
FIG. 8 is a flow chart of a control sequence, being partially modified.

FIG. 8 shows a modified example of the control sequence of FIG. 7. This differs from the FIG. 7 example in that, when the measurement method of the second or third embodiment is carried out, the exposure method to the separate frame shots for obtaining the offset value is changed. More specifically, as regards the separate frame shots, both the first time exposure and the second time exposure are carried out to expose these shots sequentially under an illumination state with a large aperture (aperture stop 4) without having any of the aperture stops 4c and 4d, and without changing the focus position. From the mark deviation in relation to the separate frame shots thus obtained, the offset value is determined. Since the structure and operation of the remaining portion of this embodiment are similar to the preceding embodiment, a duplicate description thereof will be omitted.

A fifth embodiment of the present invention will now be described. Also, in this embodiment, the structure of the apparatus used, the structure of the reticle used, and the structure of the aperture stop are similar to those shown in FIGS. 1–3, and a duplicate description and illustration will be omitted.

This embodiment uses aperture stops 4a and 4b. As described hereinbefore, the position of the aperture of the aperture stop 4a or 4b corresponds to the angle (NA) of light impinging on the wafer surface. Thus, as the position of the aperture is displaced away from the center thereof, the incidence angle becomes larger correspondingly and, also, the lateral shift amount to defocus (Z) becomes larger. Thus, the resolution increases. Also, if the size of the aperture is made larger, the influence of aberration can be reduced, and an average image plane position can be determined. In order to obtain the lateral shift amount, it is necessary to obtain the distance between two patterns.

The measurement is made as follows. First, by using the aperture stop 4a for the first illumination condition, marks 9a and 9b are photoprinted on a first shot of a dummy wafer. Subsequently, the wafer stage 12 is moved stepwise, and the second shot is exposed at the same focus positions as the preceding exposure. These exposures are repeated (step-and-repeat) so that several shots are exposed. Here, the dummy wafer used should have a sufficiently high flatness.

Subsequently, the exposure process under the second illumination condition is initiated. The wafer stage 12 is moved back to the first shot position in the exposure process under the first illumination condition, and the stage 12 is moved so that a latent image of the mark 9a and a projected image of the mark 9b, or alternatively, a projected image of the mark 9a and a latent image of the mark 9b, are superposed with each other with their centers completely registered with each other, in the best focus state. Then, the aperture stop is changed to the aperture stop 4b, and exposures of shots of the same number as the exposure process under the first illumination condition are carried out similarly, while moving the wafer stage 12 stepwise. Here, in this process procedure, the height position at each of the exposures of the shots is changed sequentially by a predetermined amount, and the focus position (wafer height position) at each shot is measured and memorized. This enables an approximation proces to be described later.

Then, the amount of relative positional deviation between the printed marks 9a and 9b is measured, in relation to each shot. Since the best focus plane has no positional deviation, a focus deviation can be represented by a positional deviation. Namely, the amount of relative positional deviation of marks in each shot is in a one-to-one correlation with the defocus amount at the corresponding wafer height position. Thus, the relation between the amount of positional deviation and the focus position as the exposure is made is linearly approximated, and from the approximation equation, a focus value with which the positional deviation becomes zero is directly calculated. In this case, since there is substantially no change in the positional deviation due to the focus by the aperture stop 4a, a focus change by the stop 4b is to be observed.

In the exposure process under the first illumination condition, as described, the step-and-repeat exposures are made without changing the focus state. However, if there is substantially no shift change due to the focus by the aperture stop 4a, the focus may be be changed.

Further, as has been described with reference to the third embodiment, pairs of the marks 9a and 9b may be provided at plural locations on the same reticle. By performing the exposure operation in the manner described above and by detecting the best focus in relation to each image height in the manner as described, the image plane measurement can be accomplished. By performing the exposure while changing the focus, if the positional deviation change relative to the focus, that is, the sensitivity, is not constant in relation to each image height, due to the lens aberration of the projection system 10, the best focus can be determined without error attributable to the difference in sensitivity.

In this case, the influence of precision in the focus positioning (height control) resulting from changing the focus position might be considered. However, at each focus position, the positioning precision has an influence, so that, as a result of exposures of plural shots, an averaging effect is necessarily produced to the measurement results. Even if the exposure is done with a fixed focus, exposures of several shots are required to attain an averaging effect so as to increase the precision in consideration of the influence of the focus positioning precision. From this standpoint, even with the measurement of this embodiment, the time necessary for the exposure and measurement is substantially unchanged. If, simply, the number of measurement points (shots) is n, an averaging effect of $1/\sqrt{n}$ is expected.

Figure 9:
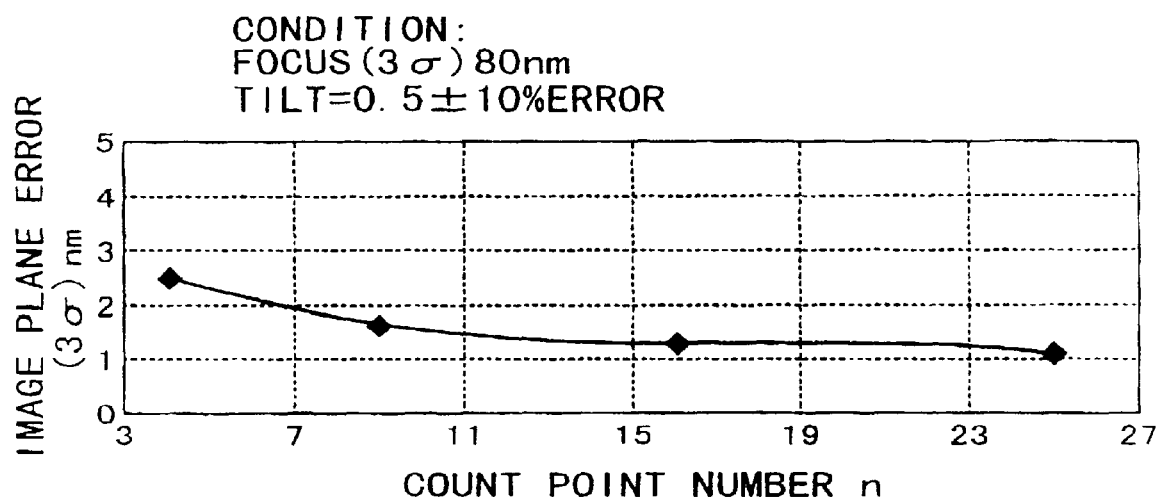
FIG. 9 is a graph for explaining the relation between the image plane error and the measurement point, in a case where the sensitivity disperses by 10%, in the present invention.
Figure 10:
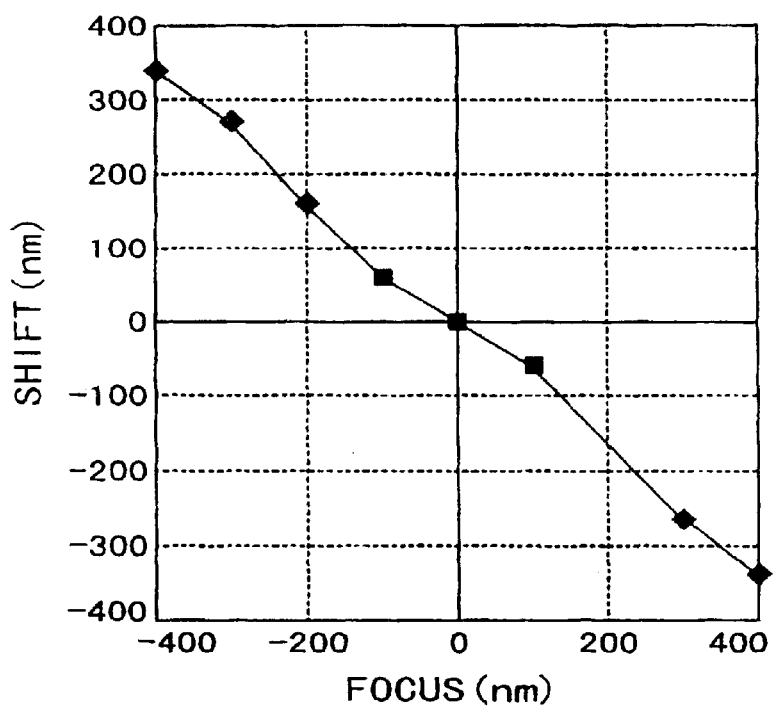
FIG. 10 is a graph for explaining the relation between the focus and the positional deviation, in the present invention.

Further, as regards the image plane, the error of focusing position within an exposed shot is basically constant for any image height, and therefore, the positional deviation error occurs due to the difference in sensitivity among the image heights. FIG. 9 shows the result of a simulation made to the dispersion of image plane (measurement error) in an example that the sensitivity is dispersed by 10% with the image heights. It is seen from this that, by increasing the number of measurement shots, the influence to the image plane can be substantially disregarded.

Figure 11:
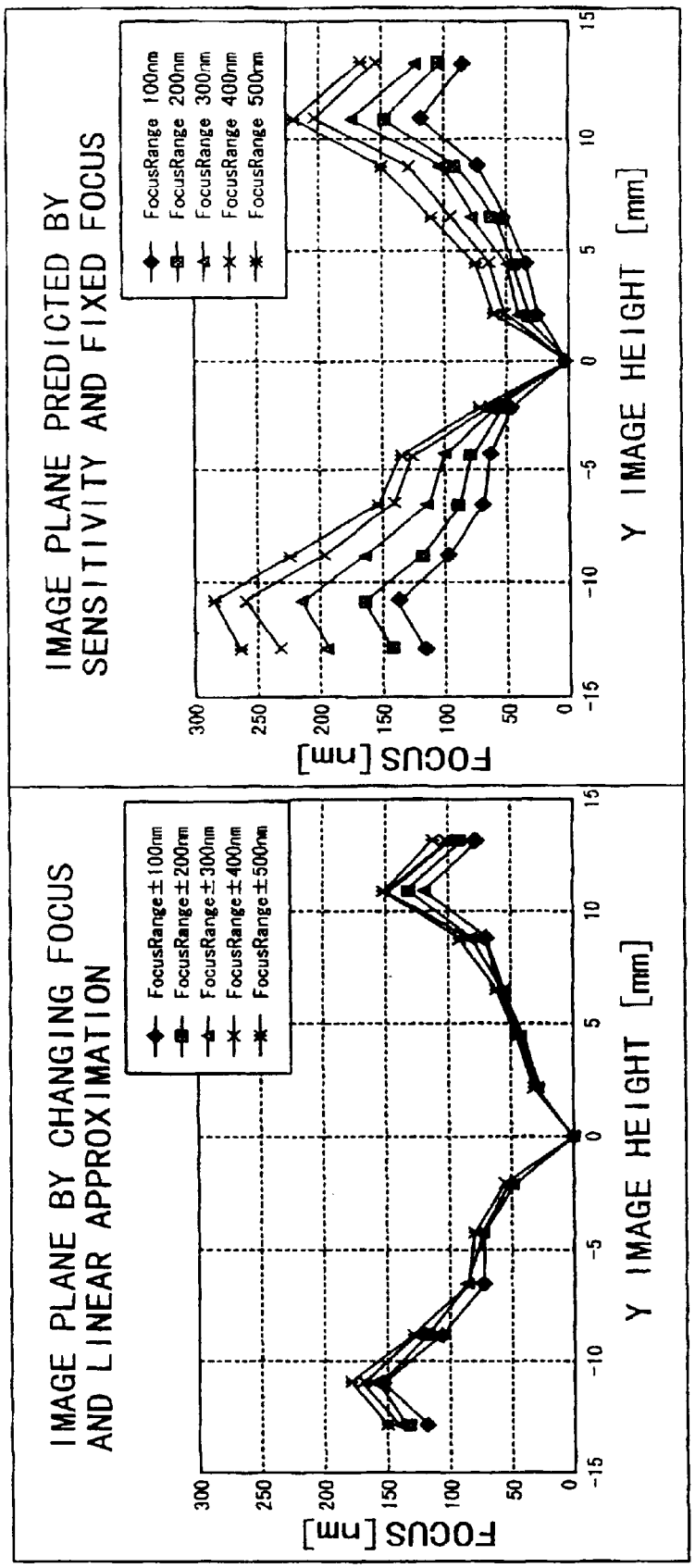
FIG. 11 is a graph for explaining dispersion of focus position of the image plane, according to the straight line approximation method in the present invention and to the conventional method.

Further, in the linear approximation described above, since, as shown in FIG. 10, a practical line obtainable is not a straight line, there may occur an image plane measurement error in dependence upon the focus range in which the linear approximation is to be made. In relation to this, the image plane was measured while changing the focus range, as illustrated in FIG. 11. It was confirmed that, generally, the influence to the image plane is small where the measurement is made by linear approximation on the basis of the data obtained while changing the focus position, as in this embodiment. If, to the contrary, the image plane is calculated from the sensitivity which is constant with image heights, while holding the focus position fixed, there occurs dispersion of the image plane in dependence upon the fixed focus position.

Also, in the fifth embodiment, aperture stops 4c and 4d may be used as in the second embodiment, by which the influence of coma aberration can be removed and the resolution can be increased to twice. This will be described in detail, as a sixth embodiment.

By using a combination of aperture stops 4c and 4d shown in FIG. 3, the exposure process is carried out in a manner like the fifth embodiment. As described hereinbefore, the aperture stops 4c and 4d are placed in an axially symmetrical relation with each other, so that the components as can be represented by odd functions of lens aberration are all cancelled. Further, since the even function components appear with a double sensitivity, the focus resolution can be increased twice.

Also, in this example, like the fifth embodiment, exposure of several shots is carried out while changing the focus by using the aperture stop 4c. Then, the wafer stage 12 is moved back to the first shot exposure position under the first illumination condition, and the stage 12 is moved so that a latent image of the mark 9a and a projected image of the mark 9b, or alternatively, a projected image of the mark 9a and a latent image of the mark 9b, are superposed with each other with their centers completely registered with each other, in the best focus state. Then, the aperture stop is changed to the aperture stop 4b, and the exposures of shots of the same number as the exposure process under the first illumination condition are carried out similarly, while changing the focus position in each shot similarly.

Then, the amount of relative positional deviation between the printed marks 9a and 9b is measured by using a measuring machine, in relation to each shot. Then, the relation between the amount of positional deviation and the focus position as the exposure is made linearly approximated, and from the approximation equation, a focus value with which the positional deviation becomes zero is directly calculated. Since pairs of the marks 9a and 9b are provided at plural locations on the same reticle, by performing the exposure operation in the manner described above and by detecting the best focus in relation to each image height in the manner as described, the measurement of the image plane as the distribution of best focus positions can be accomplished. Further, as has been described with reference to the third embodiment, if the position of the aperture stop 4c or 4d is placed upon the pupil plane portion where the tilt of the wavefront of the illumination light is flat, further improvement of the measurement precision is attainable.

In the fifth embodiment, a single ordinary aperture stop may be used without interchanging aperture stops, as in the third embodiment, and the measurement may be carried out by use of the mask such as shown in FIG. 5. This will be described in detail, as a seventh embodiment.

A reticle such as shown in FIG. 5 is used, and exposures of several shots for printing the marks 15a and 15b are carried out under the illumination condition that the marks 15a and 15b are sufficiently illuminated with light from the openings 15c and 15d, while changing the focus. After this, the wafer stage 12 is moved back to the first shot exposure position, and the stage 12 is moved so that a latent image of the mark 15a and a projected image of the mark 15b, or alternatively, a projected image of the mark 15a and a latent image of the mark 15b, are superposed with each other with their centers completely registered with each other, in the best focus state. Then, by using the same aperture stop 4, exposures of shots of the same number as the preceding exposure process are carried out to print the marks 15a and 15b with the same focus position.

Then, after the development, the amount of relative positional deviation between the printed marks 15a and 15b is measured by using a measuring machine, in relation to each shot. Pairs of such marks 15a and 15b are provided at plural locations on the reticle in relation to each image height, and the amount of relative positional deviation between these marks superposed by the double exposures is measured in relation to each image height. Further, since this method is free from the influence of a telecentricity error of the illumination system, a higher precision measurement is accomplished.

FIG. 12 shows a control sequence of a control system (not shown) for performing the measurement and a correction procedure following it, in the projection exposure apparatus shown in FIG. 1, in accordance with the fifth to seventh embodiments described above. The layout of shots where exposures are to be done practically are illustrated in the right-hand side of the flow chart.

The control system operates so that a photosensitive substrate (dummy wafer) and a reticle of the structure described above are loaded on stages by means of well-known conveyance systems. Then, while not described above, to separate frame shots on the photosensitive substrate, exposures (first time exposures) are carried out without changing the focus position. Thereafter, while changing the focus position sequentially as described hereinbefore (with the same focus position in the fifth embodiment), the first time exposures are made to the shots in the step-and-repeat method. Subsequently, the stage is moved back to the first separate-frame shot exposure position and, from there, as regards the separate frame shots, the stage is moved and the second time exposure is performed so that marks are superposed under the same illumination condition as the first time exposure (with the same aperture stop in the fifth and sixth embodiments) and also with the same focus position. This operation is made in the step-and-repeat method, sequentially to the separate frame shots.

In the seventh embodiment, a plurality of sets each comprising a pair of marks 15a and 15b such as shown in FIG. 5 and openings 15c and 15d corresponding to them, are arrayed in a row in the direction of the mark spacing DR. Also, in juxtaposition thereto, there are a plurality of sets each comprising marks 15a and 15b provided in a reverse disposition to the openings 15c and 15d, the sets being arrayed in a row in parallel to the first row. This structure is repeated in a direction perpendicular to the direction of the mark spacing DR. As regards the exposure of the separate frame shot, the exposure may be done so that the centers of the projected images of different marks in adjacent rows and with the same illumination condition are registered with a latent image on the photosensitive substrate in the best focus state.

Subsequently, to the shots in which exposures have been made in the first time exposures while changing the focus position sequentially, the second time exposures with mark registration and an illumination condition different from the first time exposure, are made sequentially in the step-and-repeat method, with the same focus position as the first time focus position, as described with reference to these embodiments.

A development process for an exposed photosensitive substrate as well as mark measurement with the use of another measuring machine are performed by a separate system outside the exposure apparatus, or it is done manually by an operator. A central control system for controlling the factory as a whole may be used to control them together with other steps. On the other hand, if it is to be done in the mark detection system of the projection exposure apparatus itself after the developed substrate is loaded on the stage (not shown), the mark measurement is carried out by use of the detecting system.

On the basis of the thus obtained measurement results, inside the control system and with respect to different image height points, data which concerns variation, with a change in focus position, of the deviation amount of the central position of the mark as illuminated under the illumination condition B, relative to the center position of the mark illuminated under the illumination condition A, is obtained. On the other hand, as regards the separate frame shots in which superposed printing has been done under the same illumination condition and with the same focus position, an all-shot average value of the center position between the superposed marks is calculated in relation to each image height point. A deviation between these marks at the separate frame shots which should inherently be registered with each other, is an offset value in this measurement system. With respect to each image height, this offset value is subtracted from the deviation average, and, based on it, linear approximation of the defocus amount and the mark deviation amount is performed. From the best focus positions at each image height point, the image plane of the projection optical system is calculated.

On the basis of the thus obtained image plane, an average focus position within the shot illumination range, for example, is determined and, based on it, the current offset value of the autofocusing system 13 is corrected. Further, a feedback is applied to an image plane correcting optical system (not shown) of the projection optical system, to perform the image plane correction.

Figure 13A:
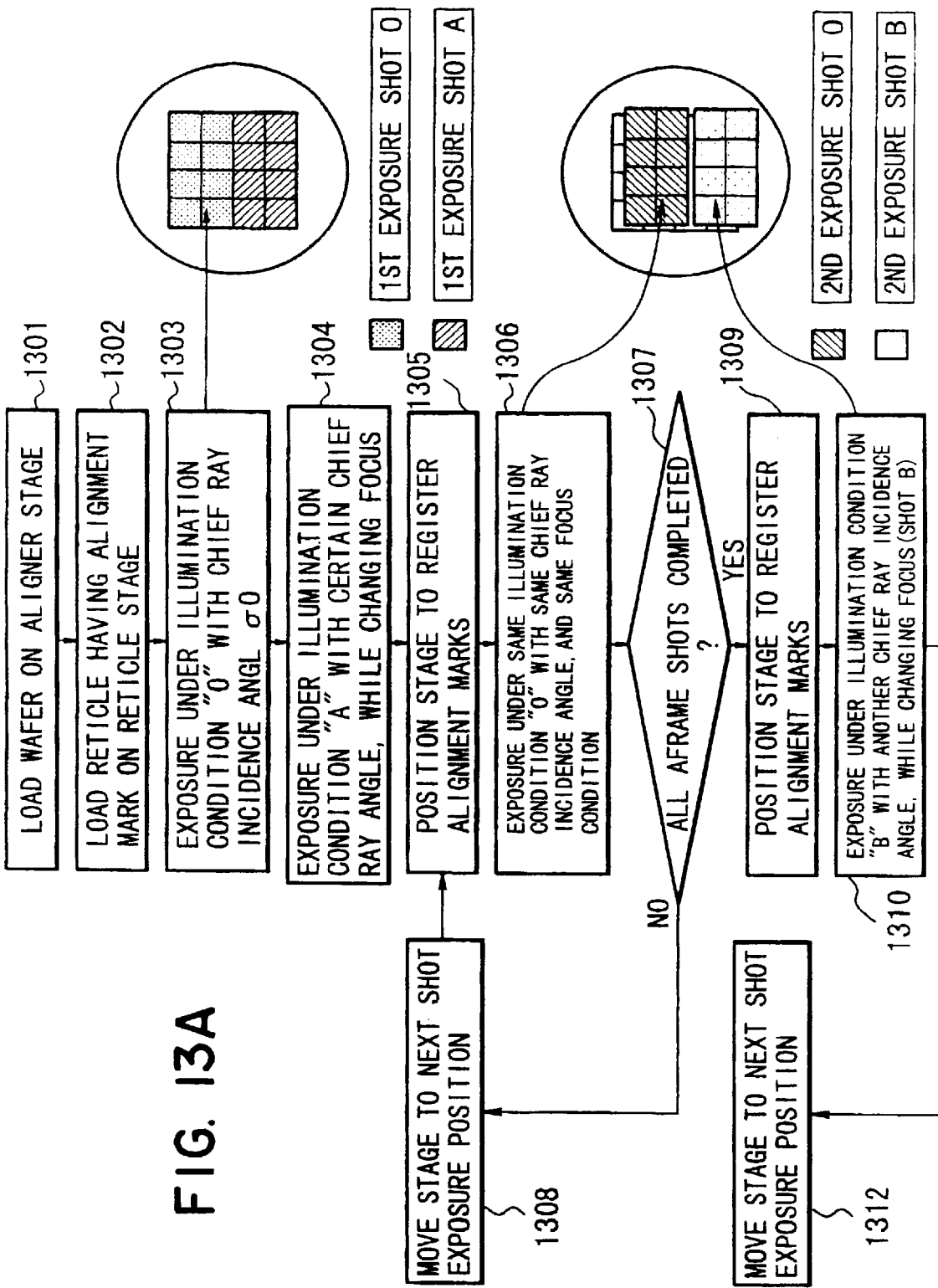
FIG. 13 is a flow chart of a control sequence, being partially modified.
Figures 13, 13A, 13B:
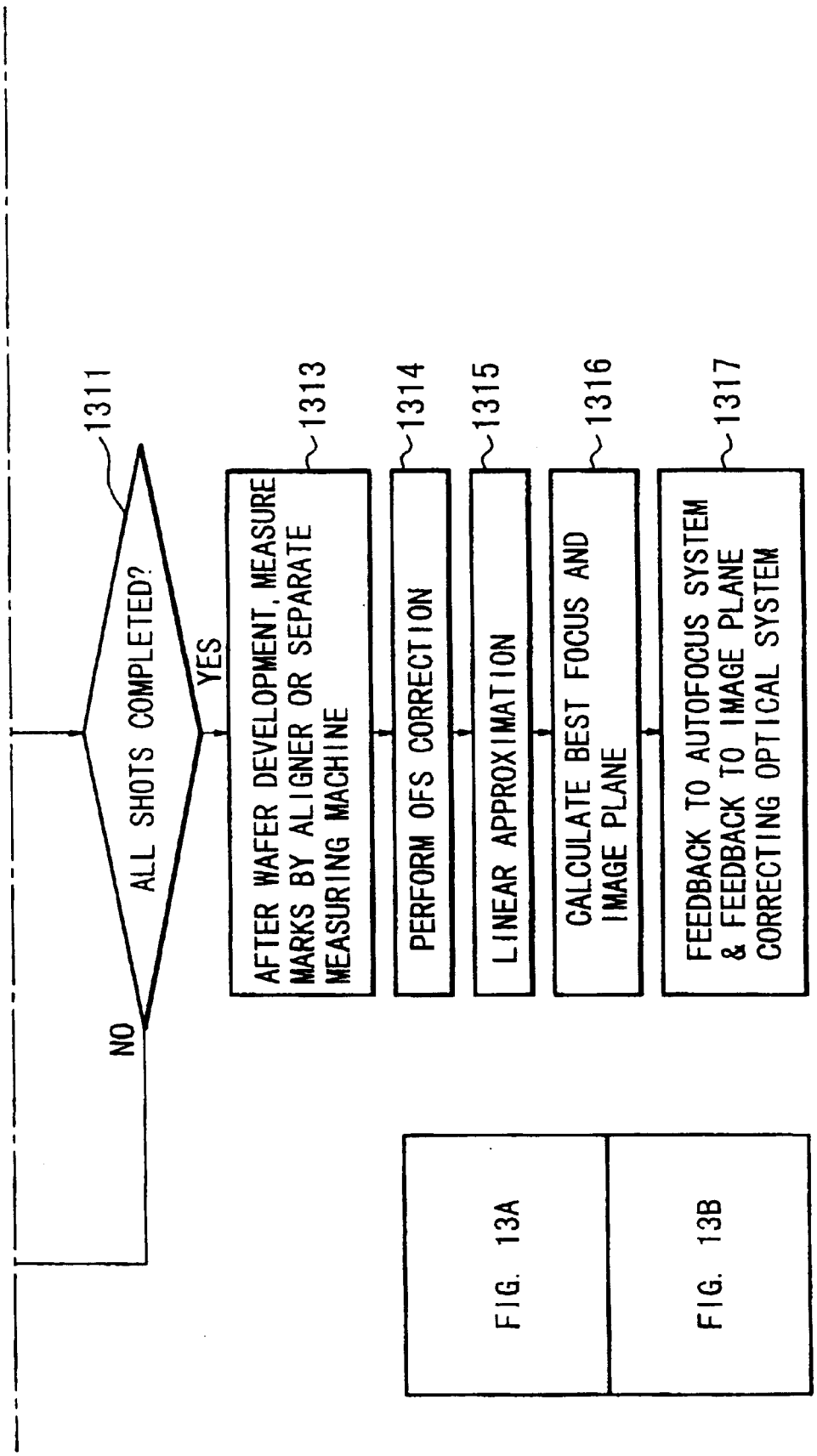

FIG. 13 shows a modified example of the control sequence of FIG. 12. This differs from the FIG. 12 example in that, when the measurement method of the sixth embodiment is carried out, the exposure method to the separate frame shots for obtaining the offset value is changed. More specifically, as regards the separate frame shots, both the first time exposure and the second time exposure are carried out to expose these shots sequentially under an illumination state with a large aperture (aperture stop 4) without having any of the aperture stops 4c and 4d, and without changing the focus position. From the mark deviation in relation to the separate frame shots thus obtained, the offset value is determined. Since the structure and operation of the remaining portion of this embodiment are similar to the preceding embodiment, a duplicate description thereof will be omitted.

Figure 14:
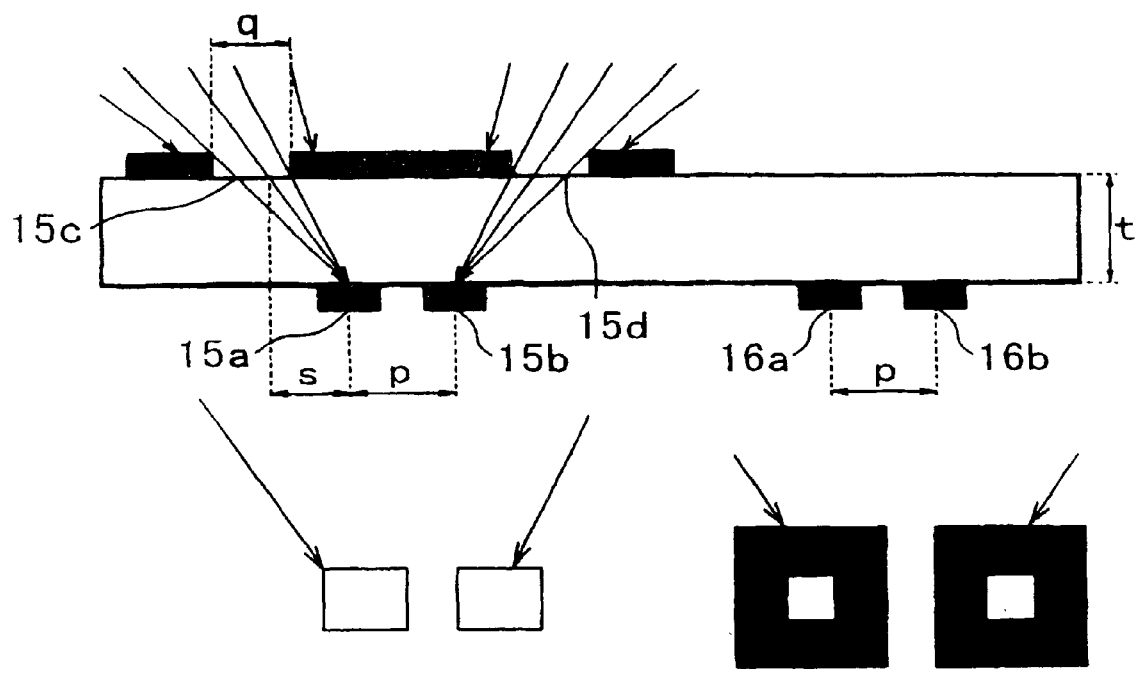
FIG. 14 is an enlarged and schematic view of a modified example of a reticle to which the present invention is applied.

FIG. 14 is a fragmentary sectional view of a reticle to be used in a measurement method according to an eighth embodiment of the present invention. This reticle has a structure similar to that of FIG. 5, and also it is formed with marks 16a and 16b. The spacing between the marks 16a and 16b is equal to the spacing between the marks 15a and 15b. Also, there is no light blocking means provided above the marks 16a and 16b, and only a glass is present there.

The measurement using this reticle is made as follows.

As in the preceding embodiment, images of the marks 15a and 15b are printed on a dummy wafer, under the illumination condition that the marks 15a and 15b are sufficiently illuminated with light from the openings 15c and 15d. At this time, images of the marks 16a and 16b illuminated through the transparent glass are also printed on the dummy wafer. In accordance with the step-and-repeat method while holding the focus position fixed, marks 15a and 15b as well as marks 16a and 16b are photoprinted on several shots sequentially.

After exposures of shots of a predetermined number are completed, the wafer stage 12 is moved back to the first shot position. By using the same aperture stop 4, exposures of the shots are carried out at this time while changing the focus at each shot. In accordance with the step-and-repeat method, the marks 15a and 15b as well as the marks 16a and 16b are printed on the shots of the same number, while positioning the stage so that, in each shot, a latent image of the mark 15a and a projected image of the mark 16a as well as a latent image if the mark 15b and a projected image of the mark 16b (or alternatively, projected images of the marks 15a and 15b and latent images of the marks 16a and 16b) are superposed one upon another with their centers registered with each other, in the best focus state. Then, after a development process, the amount of relative positional deviation ($\Delta L1$) between the marks 15a and 16a formed by the exposures as well as the amount of relative positional deviation ($\Delta L2$) between the marks 15b and 16b are measured, in relation to each shot, by using a measuring machine.

The relation between the difference L ($\Delta L=\Delta LT-\Delta L2$) of the two positional deviations as measured in the measurement process described above and the focus value as the exposure is made practically, is linearly approximated, by which a best imaging plane where ΔL=0 is determined.

The procedure described above enables removal of an error due to the precision of the twice focus positioning operations, involved in the double exposures for superposition of marks and for measurement of the positional deviation of them. Thus, a higher precision measurement is attainable. Pairs of marks 15a and 15b as well as marks 16a and 16b may be provided on a reticle, in relation to each image height, and, with respect to each image height, the amount of relative positional deviations between the superposed marks 15a and 16a and between the superposed marks 15b and 16b, may be measured. With this procedure, image plane measurement can be done with a higher precision. When the measurement method of this embodiment is to be executed by use of a projection exposure apparatus such as shown in FIG. 1, the control sequence such as described with reference to FIG. 12 may be used.

In the embodiments described above, the wafer is moved for mark superposition. However, the reticle may be moved in place thereof. Further, in these embodiments, if there occurs mark projection not to be used finally for the superposition, during the mark projection, the mark may be prevented from being projected by use of a masking blade, for example.

Referring to FIGS. 1 and 2, a ninth embodiment in which the present invention is applied to astigmatism measurement will be described. The structure of a projection exposure apparatus in this embodiment for the astigmatism measurement of a projection optical system is similar to that of FIG. 1.

Also, in this embodiment, first and second patterns 9a and 9b (FIG. 2) formed on the pattern bearing surface (bottom face) of the reticle 9, at the projection optical system 10 side and with a spacing DR, are used.

In this embodiment, the marks 9a and 9b may have the same shape.

The aperture stop 4 includes two aperture stops 4c and 4d, as shown in FIG. 3B. The position of the opening 4cl or 4dl of the aperture stop 4c or 4d shown in FIG. 3B corresponds to the position on the pupil coordinate system (coordinates on the pupil plane 10a) of the projection optical system 10. In the wavefront of the projection optical system 10, the aperture stops 4c and 4d are disposed at a location suitable for measurement of the astigmatism at the position as designated by the distance from the wavefront center (optical axis center) and the angle (direction) therefrom. On the reticle 9, there is provided a pattern of the mark 9a or 9b, formed in the incidence direction of the chief ray of the illumination light, impinging on the reticle 9 from the aperture stop 4. Here, the aperture stops 4a and 4b are placed in a symmetrical relation with each other with respect to the stop center.

Initially, as the first illumination (first illumination light), the aperture stop 4c is used to print images of the marks 9a and 9b on the photosensitive substrate. Then, the wafer stage 12 is moved so that the printed images of the marks 9a and 9b and images just to be projected are superposed one upon another on the photosensitive substrate. The aperture stop is changed to the aperture stop 4d for the second illumination, and exposures are carried out. Then, the amount of relative positional deviation between the thus superposed marks 9a and 9b is measured by using a measuring machine. Here, the amount of positional deviation comprises positional deviation components along the substrate surface, in a direction perpendicular to the direction in which a positional deviation occurs between the marks 9a and 9b as the focus error is produced. The relative positional deviation between the marks 9a and 9b may be considered as the difference in wavefront aberration in the area in which the light paths (first illumination and second illumination) restricted by the aperture stops 4c and 4d pass the pupil plane 10a.

Figure 15:
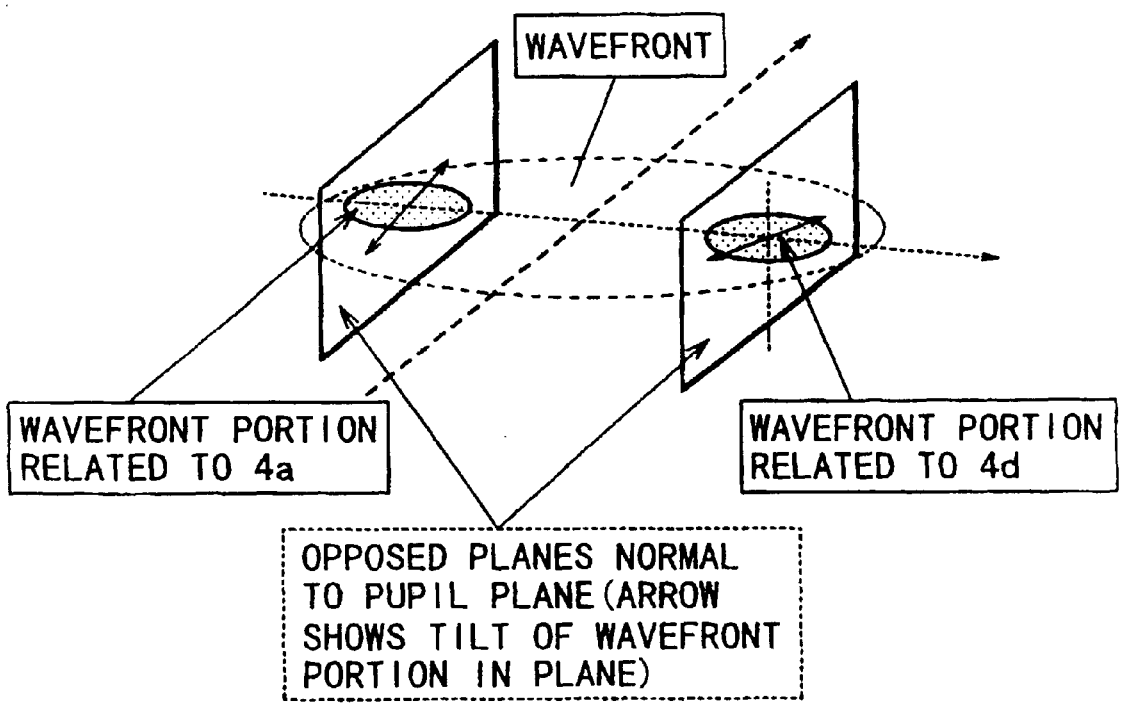
FIG. 15 is a schematic view for explaining the illumination direction of illumination light and the measurement direction, in the present invention.

FIG. 15 is a schematic view for explaining the wavefront on the pupil plane 10a of the projection optical system 10 and the wavefront of light passing through the openings 4cl and 4dl of the aperture stops 4c and 4d.

Specifically, FIG. 15 illustrates the difference in tilt of portions of symmetrical wavefronts upon the coordinates of the pupil plane 10a. Arrows in the drawing each depicts the tilt of a portion of the wavefront, in a direction along the plane. The tilt difference appears as a deviation component of the imaging position on the imaging plane (a component in a direction perpendicular to the image shift direction due to the focus change, more specifically, in a direction along the sagittal plane).

By using apertures at two locations being symmetrical with respect to the pupil center, as described above, the tilt component can be detected largely. However, in principle, the present invention is not limited to the use of openings at two positions being symmetrical with respect to the pupil center. The measurement can be done with such disposition that the chief rays are different.

Figure 16:
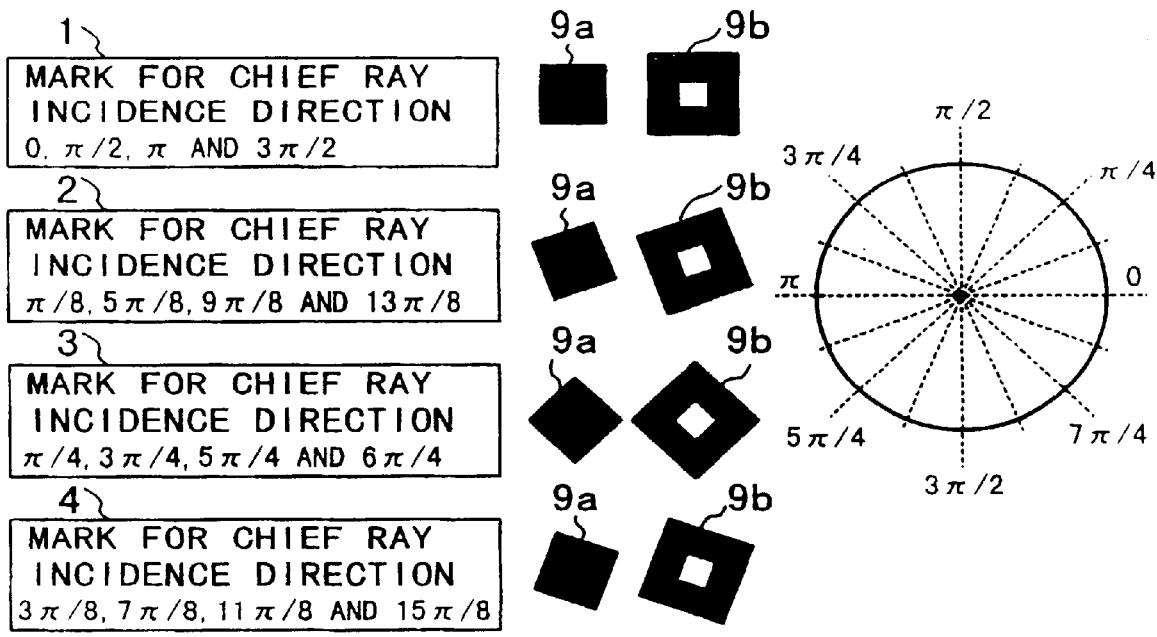
FIG. 16 is a schematic view for explaining types of registration marks to which the present invention is applied.

FIG. 16 is a schematic view for explaining the positional relation of marks 9a and 9b to be superposed, in examples wherein the incidence direction of the chief ray of the illumination light to the mask, that is, the arrayed direction of the apertures 4cl and 4dl with respect to the symmetrical axis of the center of the aperture stop), is varied.

By changing the incidence direction of the chief ray by rotating the disposition of the apertures 4c1 and 4d1 around the symmetrical center of the stop, the tilt difference between the wavefronts in the planes opposed to the array direction of these apertures on the pupil plane (in FIG. 15, it is shown as opposed planes perpendicular to the pupil plane) can be detected as a positional deviation of the marks 9a and 9b. Depending on the situation of astigmatism of the projection optical system, by changing the angle of the aperture array, the positional deviation of the marks 9a and 9b is changeable in various ways. By detecting it with respect to each of the angular components, astigmatism of the projection optical system can be determined.

Here, since the direction for measuring the positional deviation of the marks 9a and 9b (i.e., the direction perpendicular to the aperture arrayed direction in this embodiment) is changeable with the angular component, the orientation of the marks 9a and 9b should desirably be changed in relation to each of the angles, to assure that there is a side perpendicular to the direction for the measurement. FIG. 16 illustrates orientations of rectangular marks corresponding to the measurements with different angles, on the basis of the concept described above.

Here, if the areas passing the pupil plane 10a by the aperture stops 4c and 4d are at positions symmetrical with respect to the pupil center (optical axis center) and they have the same size, the aberration which is influential to the positional deviation is only the even function component that can be expressed by a Zernike polynomial. Further, by vector-resolving the positional deviation to separate the same into a direction (M) connecting the centers of areas on the pupil plane 10a as restricted by the aperture stops 4c and 4d, and a direction (S) perpendicular thereto, the result is that, as regards the positional deviation in the direction S, only an astigmatism component not influenced by defocus can be extracted. The positional deviation in the vector-resolved direction S, when expressed by the Zernike polynomial, consists of only a 2nθ component, where n is an integer, and θ represents the angle with respect to the pupil plane polar coordinates. In an example wherein a higher order up to 4θ of the Zernike polynomial is to be taken into account, only 2θ and 4θ components will be measured as the positional deviation, whereas the remaining components are removed by taking the difference in tilt between a portion of two symmetrical wavefronts. Also, the relation between the coefficients of components 2θ and 4θ and the above-described positional deviation can be expressed as follows:

$$\Delta S(\theta, R) = A(R) \star \cos 2\theta - B(R) \star \sin 2\theta C(R) \star \cos 4\theta - D(R) \star \sin 4\theta$$

where θ is the angle with respect to the pupil plane coordinates, R is the value obtainable by σ conversion of the incidence angle of the chief ray (corresponding to the distance from the pupil center of the chief ray with respect to the pupil coordinates), ΔS is the positional deviation, and A, B, C and D are coefficients.

In the equation above, by performing measurements at a few points under the condition of incidence angle R0 of a certain chief ray and through the vector resolution, the positional deviation in the direction S is detectable and, on the basis of it, the following equations are obtainable:

$$\Delta S(0, R0) = A(R0) + C(R0) \quad (1)$$

$$\Delta S(\pi/8, R0) = 1/\sqrt{2} \cdot A(R0) - 1/\sqrt{\sqrt{2} \cdot B(R0)} - D(R0) \quad (2)$$

$$\Delta S(2\pi/8, R0) = -B(R0) - C(R0) \quad (3)$$

$$\Delta S(4\pi/8, R0) = -A(R0) + C(R0) \quad (4)$$

$$\Delta S(5\pi/8, R0) = -1\sqrt{2 \cdot A(R0)} + 1/\sqrt{2 \cdot B(R0)} - D(R0) \quad (5)$$

$$\Delta S(6\pi/8, R0) = B(R0) - C(R0) \quad (6)$$

By solving equations (1)–(4), the coefficients A, B, C and D are determined. An alternative calculation may be determining the coefficients on the basis of formulae which are in a mutually orthogonal relation. For example, the coefficients A and C are detectable from equations (1) and (4), the coefficients B and C are detectable from equations (3) and (6), and the coefficient D is detectable from equations (2) and (5). By defining the thus detected coefficients newly as the amount of astigmatism, aberrations of cosine and sine components as well as 2θ and 4θ components can be measured, respectively. Thus, the astigmatism measurement can be done more exactly. Further, through investigation of the relation between the coefficients and the astigmatism as detected conventionally, the coefficients of astigmatism newly detected can be converted into the conventional astigmatism amount.

Figure 17:
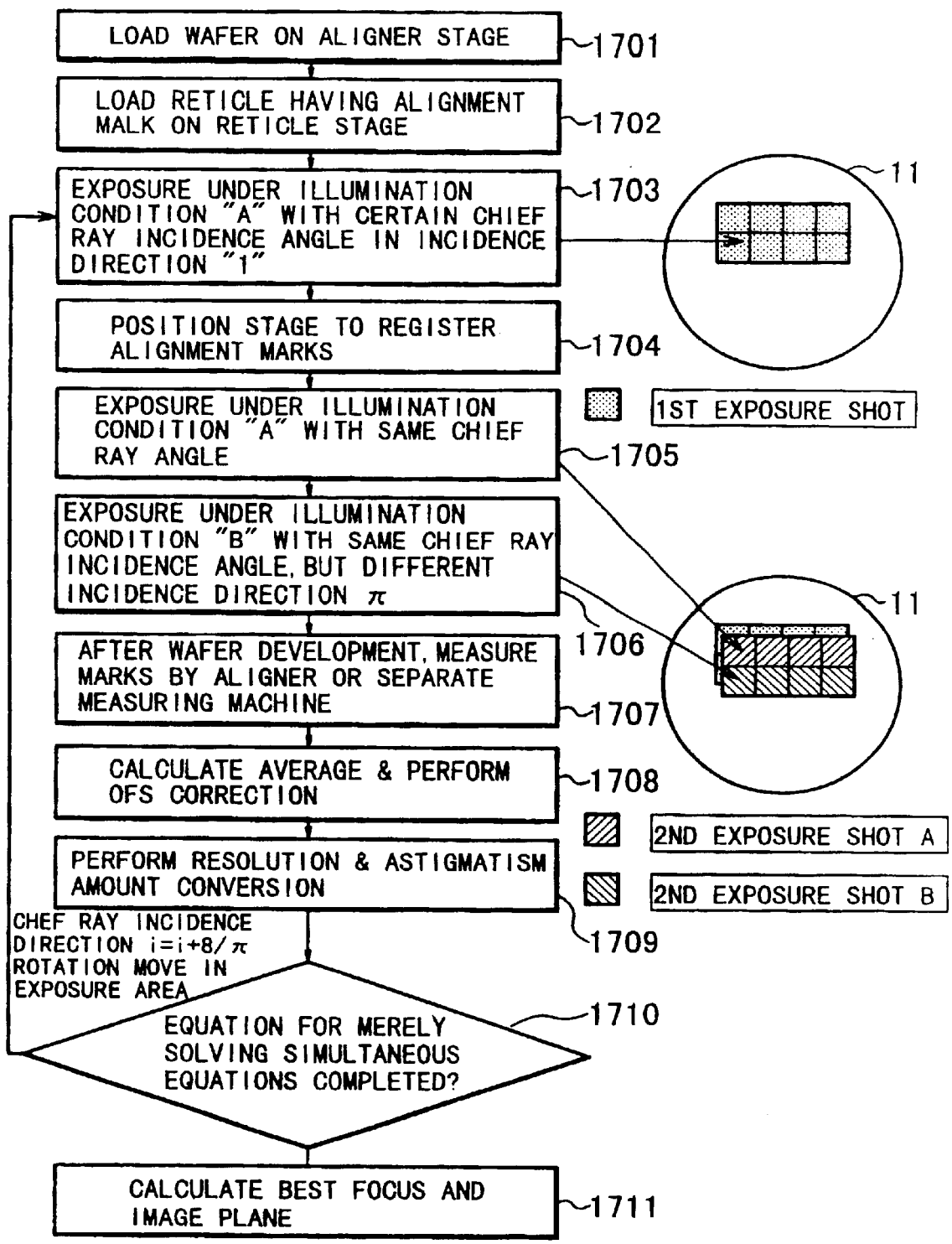
FIG. 17 is a flow chart in an embodiment of the present invention.

FIG. 17 is a flow chart of a projection exposure process in which the projection direction of illumination light is changed. The sequence includes the following steps.

1701: A photosensitive substrate 11 is loaded on an aligner stage.

1702: A reticle (mask) having marks 9a and 9b to be superposed is loaded on a reticle stage of the aligner.

1703: The first and second patterns are photoprinted under an illumination condition A (first illumination) in which the incidence direction (opening arrayed direction) of the chief ray of the illumination light is "i" and it has a predetermined incidence angle. One of them is not used for the measurement.

1704: The stage is moved so that printed images of the alignment marks 9a and 9b and images to be printed in the next exposure process are superposed one upon another on the image plane.

1705: Exposure is done under the illumination condition A having the same chief ray incidence angle as the first time exposure. The shot A is a portion where printing should be done inherently without a deviation. A deviation of this portion is used thereafter as an offset (OFT) of the system itself, in the correction process.

1706: Exposure is done under an illumination condition B (second illumination) in which the π incidence angle direction differs from the illumination condition A (the aperture positions are symmetrical with respect to the pupil center), but the incidence angle of the chief ray is the same.

Those marks not superposedly printed by the shots A and B are not used for the measurement.

1707: After development of the photosensitive substrate, by using the aligner or any other measuring machine, the positions of the marks 9a and 9b are measured.

1708: An averaging operation using measured values related to plural chips as well as an OFS correcting process based on the measurement results in relation to the offset measurement portion described above, are carried out. Average deviations at each point in the shot B as well as average deviations of each point in the shot A are detected.

1709: The amount of deviation is vector-resolved, and the relative deviation amount of the astigmatism component is converted into an astigmatism amount, on the basis of the correlation coefficient.

In a step following the above, the incidence direction "i" of the chief ray of the illumination light is rotated by i=i+8/π to move the exposure area, and a similar procedure is carried out.

1710: A discrimination is made as to whether an equation for merely solving simultaneous equations is completed or not.

1711: If the measurement of predetermined times is completed, from the simultaneous equations, astigmatism with respect to each component is calculated.

Although it is not illustrated in the drawing, an actuator (not shown) may be used to move an aberration correcting optical system (not shown) inside the projection optical system, in accordance with each of the thus determined astigmatisms of different components, to perform the astigmatism correction.

Figure 18A:
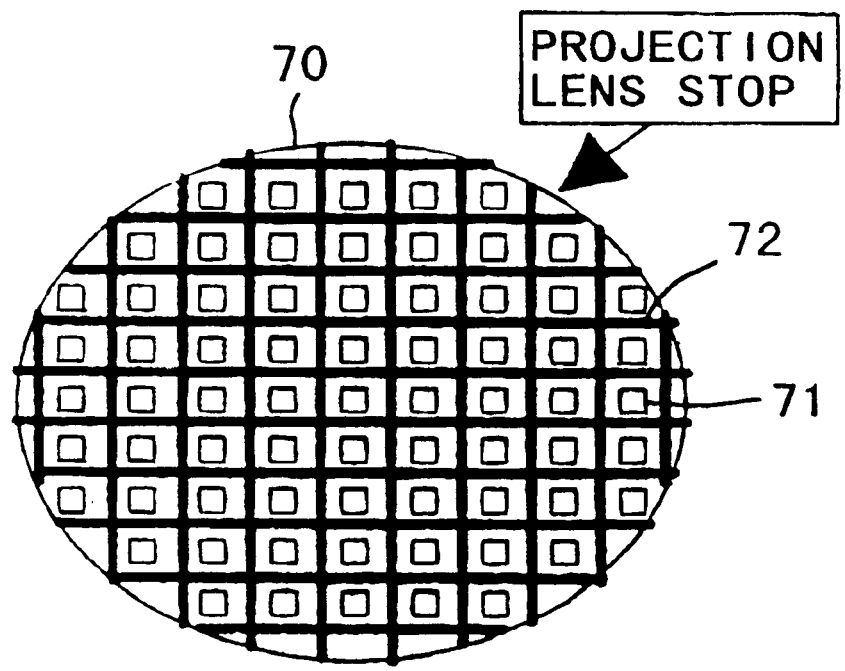
FIGS. 18A and 18B are schematic views, respectively, for explaining a pupil plane of a projection lens, in a conventional measurement method.
Figure 18B:
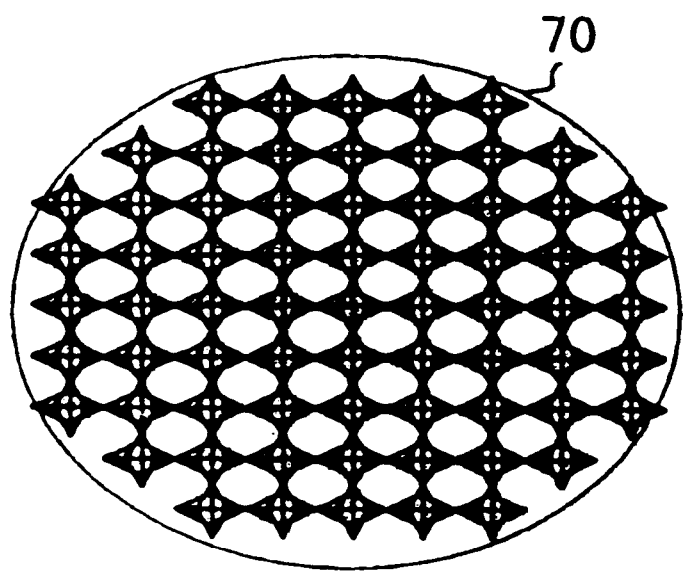

FIGS. 18A and 18B show comparative examples in which, where multiple-point measurements are made inside the projection lens and with regular intervals, astigmatism is determined on the basis of a transferred pattern on a wafer and the amount of shift of a measurement mark.

As shown in FIG. 18A, relative deviations between inner boxes (pattern) 71 in longitudinal and lateral directions and outer grids (pattern) 72 in longitudinal and lateral directions, are measured over the whole surface inside the stop 70. The thus measured lateral deviation (relative deviation) corresponds to the tilt (differentiated value) of wavefront at the pupil coordinate position of the projection lens measured. FIG. 18B shows the tilt of wavefront at each measurement point, in terms of vectors.

Here, in any one of the inner box 71 and outer grid 72, there is a lateral deviation produced due to the wavefront aberration of the projection exposure system used. In the other, there is an aberration already formed on a wafer, having been printed by a separate and known projection optical system. The disposition thereof is known, and it can function as a reference. Namely, in the other, there is no deviation due to the wavefront aberration of the projection optical system which is the subject of the measurement.

Alternatively, from the lateral deviation (tilt of wavefront), the wavefront itself may be calculated and, through an approximation procedure using the Zernike polynomial, for example, aberration coefficients to be detected can be calculated.

FIGS. 19A and 19D are schematic views for explaining transferred patterns on a wafer in this embodiment (the relation between the measurement positions on the pupil plane and the measurement marks) as well as the manner of detecting the astigmatism on the basis of the amount of shift of the measurement mark.

FIG. 19A shows two types of pattern disposition. In the left-hand side of the drawing, to the mark itself, the mark rotation as being resolved into an astigmatism component and a focus component (FIG. 19B) is applied. Also, as regards the unified mark rotation such as depicted in the right-hand side of the drawing, it can be resolved into an astigmatism component and a focus component, on the basis of vector calculation.

Relative deviations between inner boxes (patterns) 81 passed through the wavefronts being symmetrical with respect to the pupil center and outer boxes (patterns) 82, are measured in terms of the distance R from the common center of the stop 80, with respect to every point. The thus measured shift vector is then resolved into an astigmatism component and a focus component. By solving simultaneous equations using the astigmatism components at each of the measurement positions, astigmatisms in each of the components can be calculated.

FIG. 19B shows astigmatism components and focus tilt components, in terms of the distance from the center of the stop 70.

Since the thus calculated astigmatism is a shift, if it is to be converted into a conventional astigmatism amount, as shown in the lower half of FIG. 19B, a conversion coefficient may be calculated on the basis of a shift correlation graph, obtainable with the conventional method and the method of this embodiment.

As compared with the comparative example described above, the measurement method of this embodiment has advantages that the number of measurement points is smaller and astigmatism can be calculated in a shortened time period and with a simple procedure. Namely, it is specialized for the astigmatism measurement.

Further, it is not influenced by defocus, and also the reproducibility is good because the mark (pattern) is large and the influence of the exposure amount is small.

Further, it can used in combination with oblique incidence image plane measurement. Particularly, the image plane and the astigmatism can be measured simultaneously, under the multiple-point measurement and in a short time period.

In a tenth embodiment of the present invention, the measurement is carried out by using a special mask M. In this embodiment, a special mask such as shown in FIG. 5 is used. In the tenth embodiment, a single aperture stop is used, rather than changing the aperture stops. Also, a mask (reticle) M such as shown in FIG. 5 is used to perform astigmatism measurement. More specifically, as in the fourth embodiment, the aperture stop 4 does not restrict the light, but a similar effect is attained apparently by means of holes 15c and 15d.

In this case, those with the disposition of the holes 15c and 15d relative to the marks being changed in the rotational direction, along the pattern bearing surface, may be provided at separate locations on the mask. On that occasion, a state in which the chief ray incidence direction "i" is changed, as described hereinbefore, can be produced easily and in parallel. Thus, a set of marks 15a and 15b and holes 15c and 15d in which the chief ray incidence direction "i" is changed successively by 8/π may be provided on one mask, in juxtaposition. This enables that, without repeating the similar processes while changing the direction "i" as described, positional deviations in relation to angular components in the diagonal directions on the pupil plane are detected in a single process. Depending on the situation, they may be provided separately on separate masks for measurements in relation to angular components, so that the measurements may be done in separate processes.

The mask M such as shown in FIG. 5 is used and, as in the ninth embodiment described above, the marks 15a and 15b are photoprinted by a single exposure. After this, the stage 12 is moved so that the marks 15a and 15b are superposed one upon another, and, by using the same aperture stop 4, the marks 15a and 15b are printed again. Then, a relative positional deviation between the thus printed marks 15a and 15b is measured by using a measuring machine. Since this method is free from an influence of a telecentricity error of the illumination system, a good precision is attainable.

Figure 20:
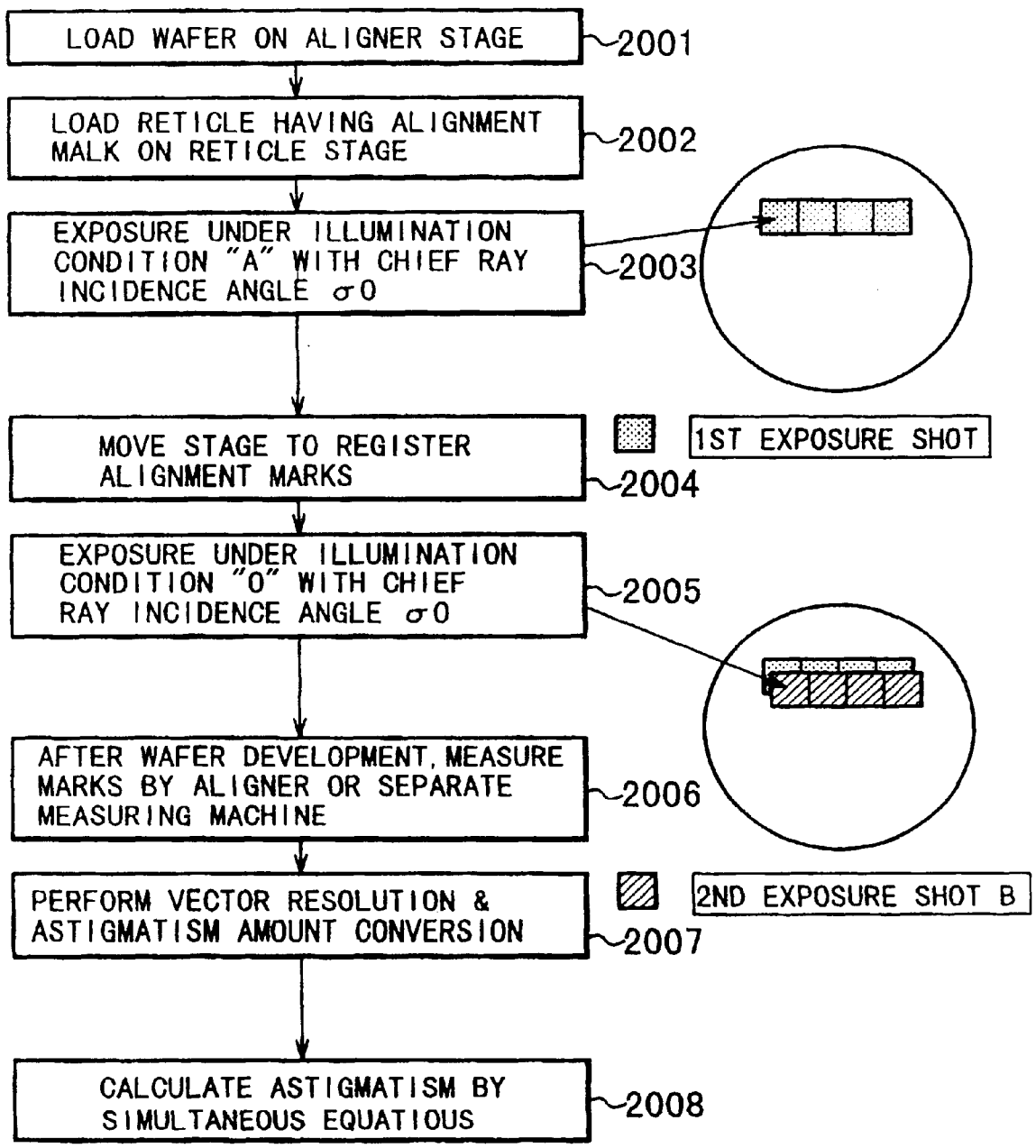
FIG. 20 is a flow chart in an embodiment of the present invention.

FIG. 20 is a flow chart in a case wherein a dual exposure process is performed by using a special mask in this embodiment.

In FIG. 20, the sequence includes the following steps:

2001: A photosensitive substrate (wafer) 11 is loaded on an aligner stage.

2002: A reticle (mask) having marks 15a and 15b to be superposed is loaded on a reticle stage of the aligner.

2003: The mark 15a is printed by use of partial illumination light (illumination condition A) through the hole 15c, while keeping the illumination light chief ray incidence angle σ0. Even if the mark 15b is printed simultaneously, it is not used for the measurement.

2004: The stage is moved so that printing position of the alignment mark 15a and the printing position of the alignment mark 15b are registered with each other.

2005: The mark 15b is printed by use of partial illumination light (illumination condition O) through the hole 15d, while keeping the illumination light chief ray incidence angle σ0 (shot B). Even if the mark 15a is printed simultaneously, it is not used for the measurement.

2006: After development of the photosensitive substrate, by using the aligner or any other measuring machine, the positions of the marks 15a and 15b are measured.

2007: After the averaging operation using the results of measurements made to plural shots, the amount of positional deviation is vector-resolved, and the relative deviation amount of the astigmatism component is converted into an astigmatism amount, on the basis of the correlation coefficient.

2008: By using the thus obtained values, and from the simultaneous equations, astigmatism with respect to each component is calculated.

In this embodiment, the OFT operation described hereinbefore is omitted However, it may be done as in the ninth embodiment.

The structure of the remaining portion of this embodiment is similar to the ninth embodiment.

Figure 21:
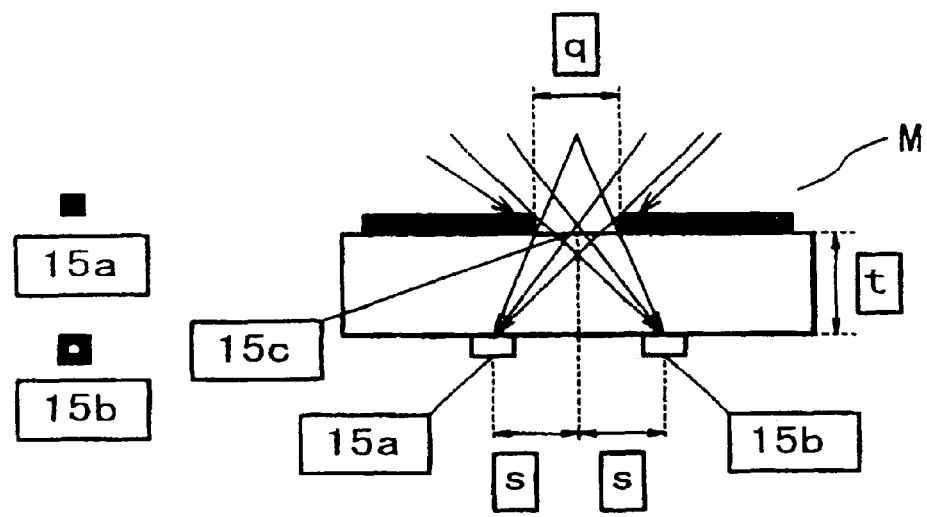
FIG. 21 is an enlarged and schematic view of another example of a reticle to which the present invention is applied.

FIG. 21 is a schematic view for explaining a special mask M according to an eleventh embodiment of the present invention.

This embodiment is based on a similar concept as that of the tenth embodiment which uses the mask M of FIG. 5. By using a mask M shown in FIG. 21, in this embodiment, astigmatism of the projection system is measured on the basis of relative positional deviation. In FIG. 21, the components corresponding to those of FIG. 5 are denoted by the same reference numerals.

The mask differs from the FIG. 5 example in that marks 15a and 15b which are disposed equidistantly from a single opening 15c are exposed simultaneously with exposure light projected from the opening 15c. Even with this structure, chief rays of the illumination light to the marks can be different from each other. Also, in this case, since the marks are exposed at once, there is no necessity of repeating the superposed exposure in relation to each incidence direction of illumination light. Additionally, there is no necessity of providing apertures in relation to separate incidence directions. It should be noted here that the mask of FIG. 21 may be used similarly for the best focus position measurement, as described hereinbefore.

Figure 22:
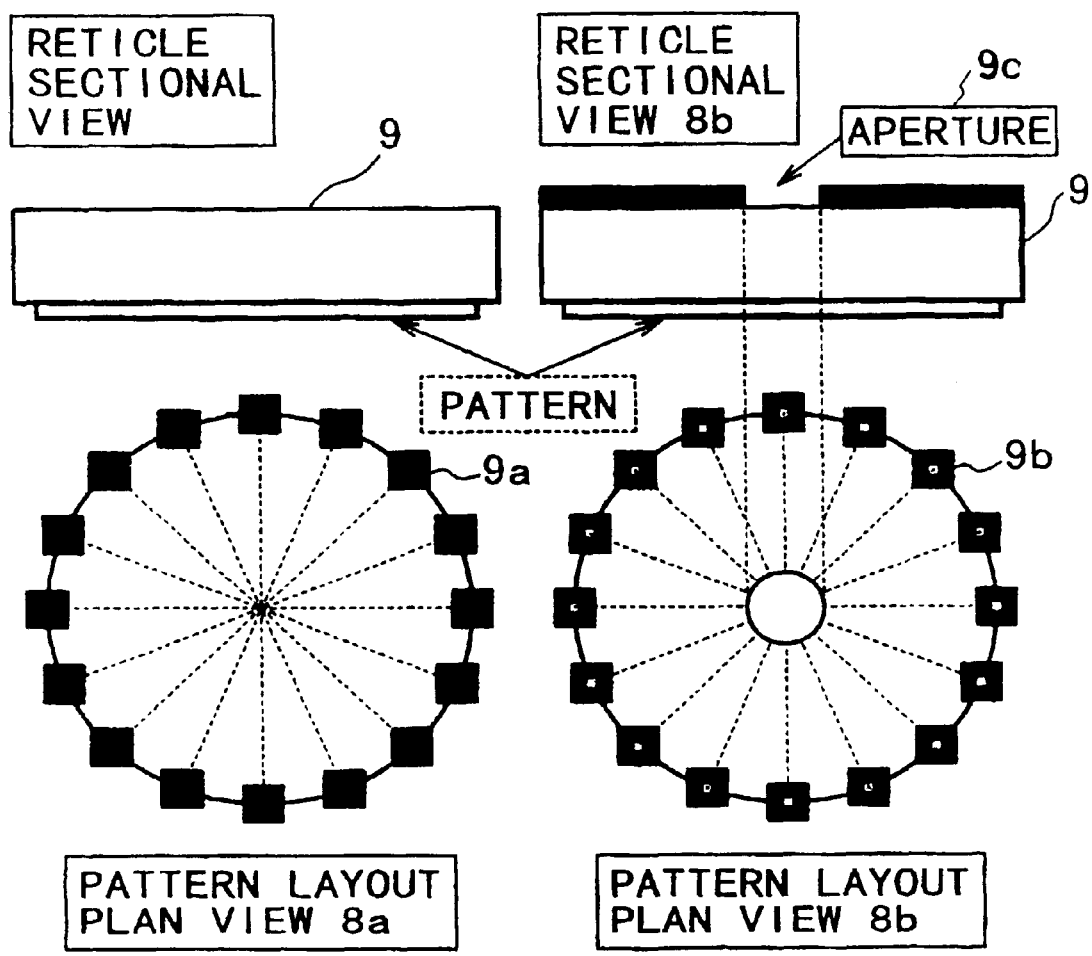
FIG. 22 is an enlarged and schematic view of a further example of a reticle to which the present invention is applied.

Practical use will be described with reference to FIG. 22. On the reticle 9, there are a mark group 8a having marks 9a disposed concentrically, and another mark group 8b including marks 9b disposed along a concentric circle of the same size as that of the mark group 8a. Also, there is an aperture 9c defined above the mark group 8b, for restricting the incidence angle of the illumination light. The reticle shown in FIG. 22 is used, and the exposure is carried out by using ordinary illumination. However, in order to prevent the light, having illuminated the mark group 8a, from diffractively impinging on the mark group 8b, a sufficient distance and a light blocking characteristic are assured. The stage is then moved so that the printed mark group 9a and the mark group 8b to be printed next are superposed one upon another on the image plane, and the exposure is made again by using ordinary illumination. With this procedure, all the mark groups superposed one upon another can be measured, and the difference $\Delta S(\theta)$ of positional deviations in each illumination direction can be calculated. The equation therefor is as follows.

$$\Delta S(\theta i) = \Delta 1(\theta i) - \Delta 1(\theta i + \pi)$$

where $\Delta 1(\theta i) = Xia - Xib$,
wherein Xia is the positional deviation in the direction S of the pattern direction i (rad) of the mark group 8a, and Xib is the positional deviation in the direction S of the pattern direction i (rad) of the mark group 8b.

With the procedure described above, the aforementioned formula can be solved by use of a single hole and a single superposed printing process, and astigmatisms in relation to each component can be measured.

The structure of the remaining portion of this embodiment is similar to the tenth embodiment.

In accordance with the measurement methods according to the embodiments of the present invention as described above, two measurement marks are exposed twice with two different incidence angles of illumination light and, additionally, the marks are superposed on the basis of the stage motion, whereby a relative positional deviation of them is measured. This assures high precision measurement of astigmatism aberration.

There is no error in relation to the exposure amount, and the measurement time is short. Since there is no necessity of condition setting, a measurement method of higher throughput is accomplished.

Further, since the measurement is less influenced by other aberrations including the focus, the astigmatism amount can be determined without variation depending on the process or condition. This leads to the possibility of standard astigmatism evaluation, and the current inspection time required separately for different illumination conditions or patterns can be significantly reduced.

In the ninth embodiment and the embodiments following it, two marks are printed in superposition for the sake of improved detection precision, if the spacing between the printed marks is predetected and the shape precision as well as the measurement precision are assured, two marks as printed at widely spaced positions may be used.

In the ninth embodiment and the embodiments following it, the wafer is moved for the superposition of two marks. However, the reticle or mask side may be moved in place of it. Further, in these embodiments, if a mark which is not to be used finally for the superposition is projected, a masking blade or the like may be used to prevent projection of such a mark.

Next, a twelfth embodiment in which the best focus measuring method, the image plane measuring method and the astigmatism measuring method, described hereinbefore, are applied to a projection exposure apparatus, will be described. In this embodiment, the position of a best focus plane of a projection optical system in a projection exposure apparatus is automatically measured (by using detecting means), and then it is corrected by using correcting means 21.

Figure 23A:
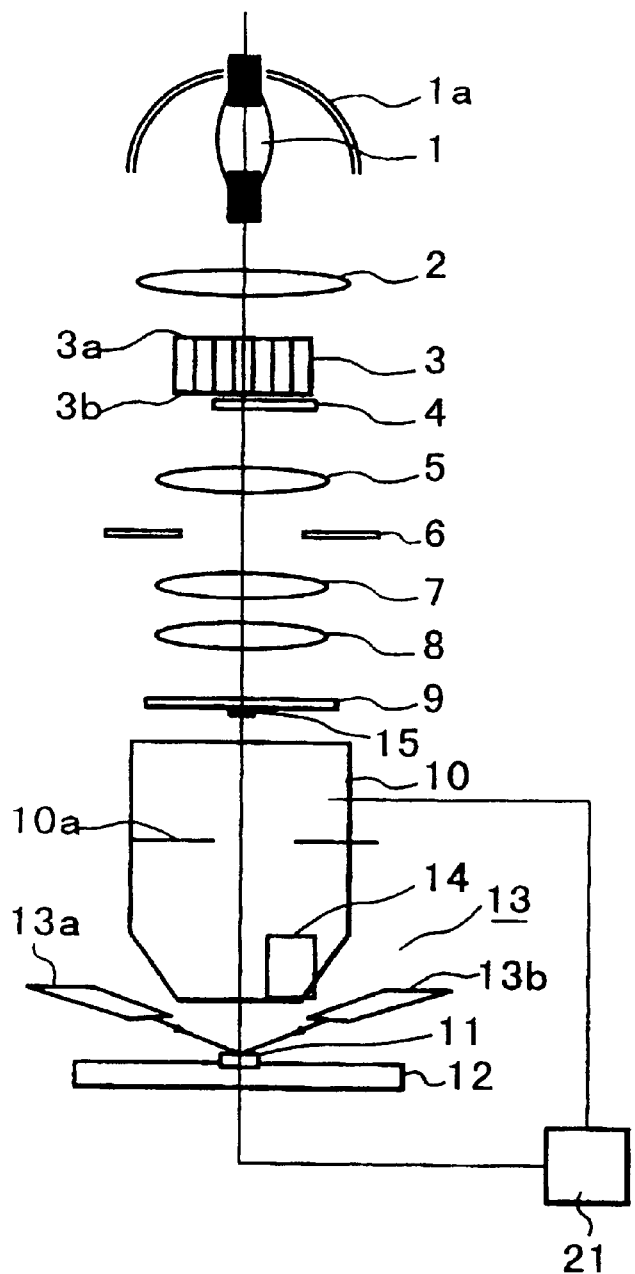
FIGS. 23A, 23B and 23C are schematic views, respectively, of a projection exposure apparatus according to another embodiment of the present invention.

In FIG. 23A, the components corresponding to those shown in FIG. 1 are denoted by the same reference numerals, and a description thereof is omitted.

Figure 23B:
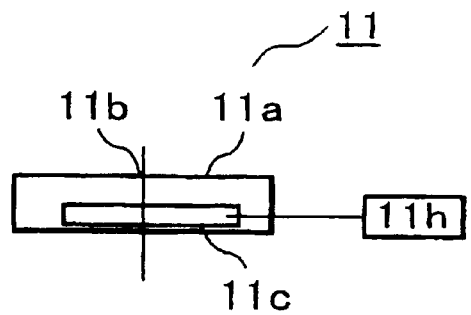

In this embodiment, with the exposure light, an image of a pattern formed on the pattern bearing surface of a reticle 9 is imaged on a plate 11a (FIG. 23B) placed on a wafer stage 12, through a projection optical system 10. The rear focal plane of the fly's eye lens 3 is approximately conjugate with the pupil plane 10a of the projection optical system 10. The plate 11a has a slit 11b formed thereon, and light passing through this slit 11b is received by a photoreceptor 11c, whereby, through a light reception process, it is detected.

The plate 11a, the slit 11b and the photoreceptor 11c are all placed on the wafer stage 12, and they serve as components of a detector unit (detection system) 11. The wafer stage 12 comprises an X-Y stage 12a for positioning the detection system 11 at a desired position along a plane perpendicular to the optical axis of the projection optical system 10, and a Z stage 12b for setting the focus position of the detection system 11 with respect to a direction parallel to the optical axis of the projection optical system 10, and the like.

Further, in this embodiment, like the first embodiment, there is an autofocusing system 13 for detecting the focus position of the detection system 11.

The method of automatically detecting the best focus position of the projection optical system 10 will now be described.

Figure 24:
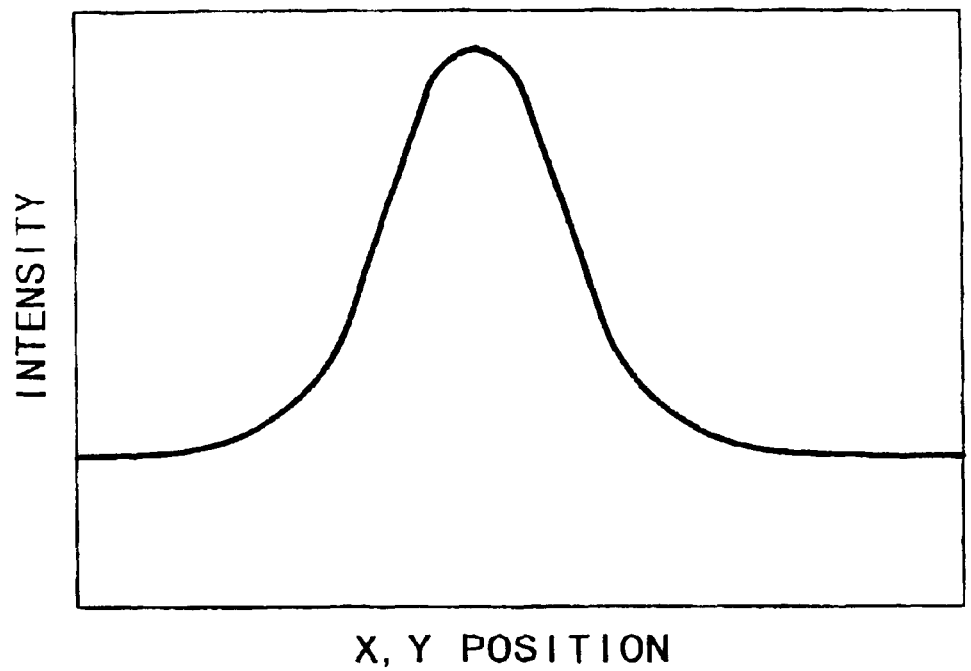
FIG. 24 is a graph for explaining the light intensity distribution of an aerial image.

A test pattern (pinhole or linear slit) 15 is provided on the pattern bearing surface (bottom face) of the reticle 9. A first illumination light defined by the aperture stop 4c (FIG. 3B) is projected to this test pattern 15, and an image of that pattern is formed on the plate 11a mounted on the wafer stage 12, through the projection optical system 10. Then, the wafer stage 12 is moved, and the light passing through the slit pattern 11b provided on the plate 11a is detected by a photoreceptor 11c which may comprise a light intensity detector or a light quantity detector. Then, the wafer stage 12 is moved in the optical axis direction (Z direction) of the projection optical system 10, and simultaneously, the stage 12 is moved along a plane (X-Y plane) orthogonal to the optical axis direction, and in the same direction as the incidence direction of the first illumination light, such that, in synchronism with the X and Y motions, the light passing through the slit pattern 11b is detected by means of the photoreceptor 11c. FIG. 24 shows a detection signal related to the X and Y position of the stage 12 and obtainable with the photoreceptor 11c in accordance with the transmitted light intensity or quantity, as detected. In relation to the detection signal of FIG. 24, the central position in the X and Y directions of the test pattern 15 as imaged on the plate 11a is calculated. Further, the stage 12 is moved in the Z direction and, for each position in the Z direction, the central position of the pattern 15 in the X and Y directions is calculated.

Subsequently, the aperture stop of FIG. 3B is changed to the stop 4d, so that the test pattern 15 is illuminated with second illumination light having the same chief ray tilt angle with the first illumination light and having an incidence direction being symmetrical with respect to the incidence surface. Then, similarly, for each Z position, the imaging central position of the test pattern 15 is calculated.

Figure 25:
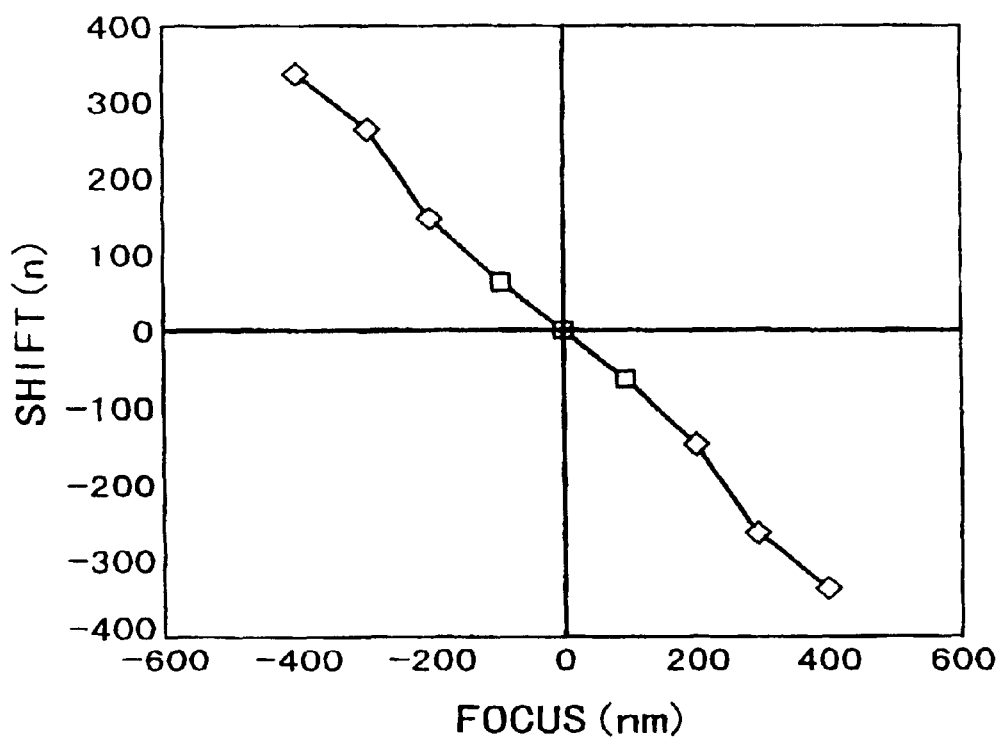
FIG. 25 is a graph for explaining the relation between the Z position and the lateral shift.

At this time, the relation between the calculated Z position (focus) and the imaging central position (lateral shift amount) of the test pattern 15 is approximately linear, as shown in FIG. 25. In consideration of it, the relation between the Z positions as calculated on the basis of two different illumination lights and the imaging central position of the test pattern are respectively linearly approximated. Then, the Z position where the thus obtained two straight lines intersect with each other is detected automatically and it is fed back, whereby automatic correction of the best focus is attained.

Since the position of the aperture of the aperture stop 4c or 4d corresponds to the angle (NA) of light impinging on the wafer, as the position of the aperture is made away from its center, the incidence angle becomes larger correspondingly and, also, the lateral shift to defocus (Z direction) becomes larger. Thus, the resolution for the best focus position detection increases.

Further, one and the same reticle may be provided with plural test patterns 15 at different locations. On that occasion, by performing the exposures as described above and by detecting the best focus at each image height in the manner described above, the image plane measurement can be accomplished. Moreover, since the deviation component in the direction perpendicular to the image shift direction due to the focus change represents the tilt difference in wavefront attributable to astigmatism, as described hereinbefore, by rotating the direction of apertures of the aperture stops 4c and 4d by 90 degrees and by performing a similar measurement operation, the tilt difference in wavefront can be measured. Namely, astigmatism measurement can be done. Here, by moving a correction optical system inside the projection optical system 10 with the use of correcting means 21, automatic correction of the image plane or astigmatism is attainable. On that occasion, the aperture direction (corresponding to the chief ray incidence direction) may be changed as described hereinbefore, and also the scan direction of the test pattern (as well as the slit direction in the case of a slit) may be changed accordingly. With this procedure, data related to different directions is obtained, and they may be substituted into equations (1)–(6) mentioned above. This enables more exact astigmatism measurement.

Figure 23C:
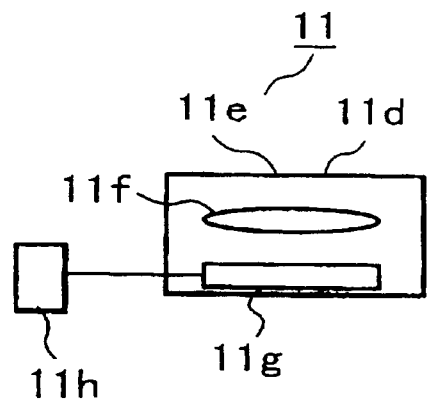

FIG. 23C is a schematic view of a main portion of a photoreceptor according to a thirteenth embodiment of the present invention. Since the structure of the remaining portion of this embodiment is similar to the twelfth embodiment, only the photoreceptor portion is illustrated and explained. In this embodiment, like the twelfth embodiment, a test pattern (pinhole or linear slit) 15 is provided on the reticle 9. There is an opening 11e formed on the plate 11d, and first illumination light defined by the aperture stop 4c (FIG. 3B) is projected to the test pattern. The image of the pattern is formed on the plate 11d mounted on the wafer stage 12 through the projection optical system 10. From the opening 11e and through an imaging optical system (lens system) 11f, an image of the test pattern 15 is re-imaged upon a one-dimensional or two-dimensional light receiving surface 11g. While moving the stage 12, the thus obtained image is processed by a data processing system 11h, whereby the position of the image is detected. The stage is moved in the optical axis direction (Z direction) of the projection optical system, and the central position of the test pattern imaged upon the plate 11a is calculated. The stage 12 is further moved in the Z direction and, similarly, at each Z position, the central position of the test pattern 15 is calculated.

Subsequently, the aperture stop is changed to the stop 4d, so that the test pattern 15 is illuminated with second illumination light having the same chief ray tilt angle with the first illumination light and having an incidence direction being symmetrical with respect to the incidence surface. Then, similarly, for each Z position, the imaging central position of the test pattern 15 is calculated.

At this time, the relation between the calculated Z position (focus) and the imaging central position (lateral shift amount) of the test pattern 15 is approximately linear, as shown in FIG. 25. In consideration of it, the relation between the Z positions as calculated on the basis of two different illumination lights and the imaging central position of the test pattern are respectively linearly approximated. Then, the Z position where the thus obtained two straight lines intersect with each other is detected automatically and it is fed back, whereby automatic correction of the best focus is attained.

A plurality of test patterns may be provided at different locations on one and the same reticle. On that occasion, like the twelfth embodiment, the image plane can be detected and, similarly, astigmatism can be measured by rotation of the aperture stop about the optical axis, by 90 deg. Further, automatic correction of them is attainable.

Figure 26:
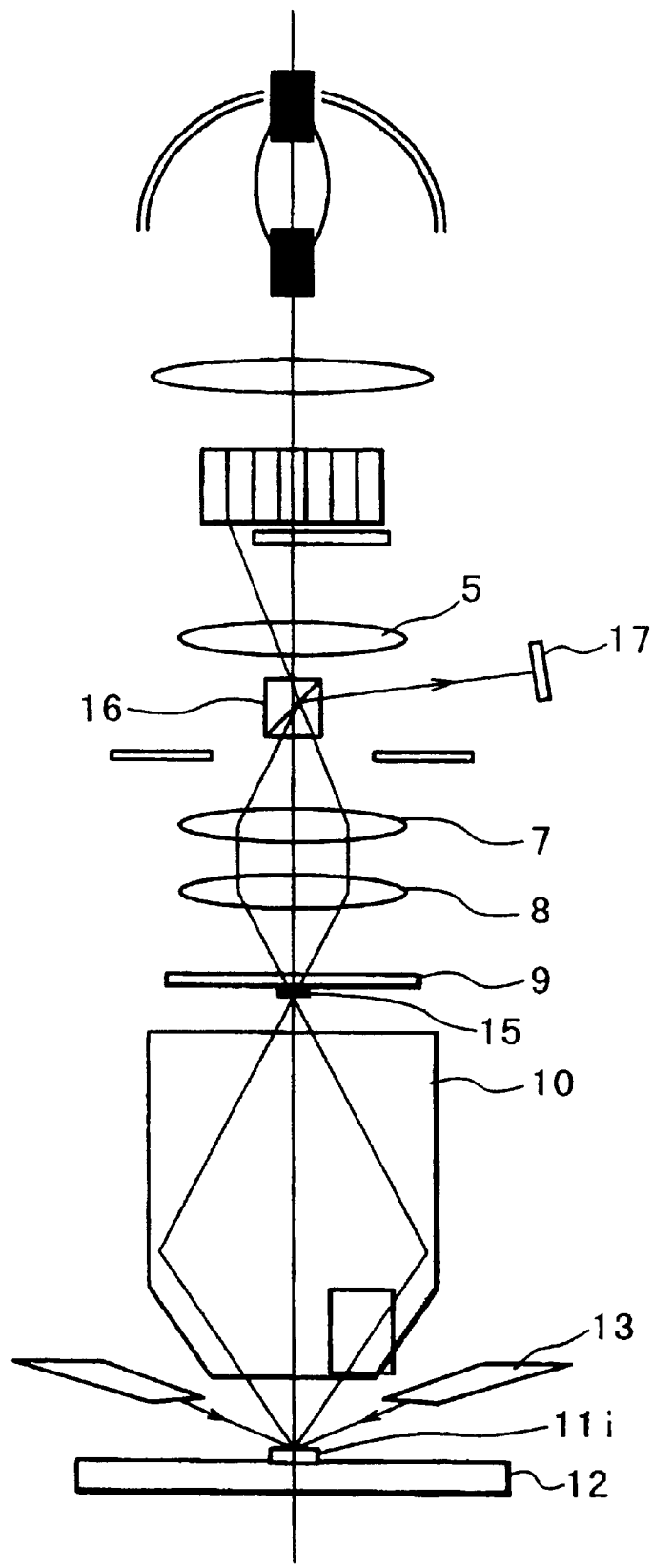
FIG. 26 is a schematic view of a main structure according to an embodiment of the present invention.

FIG. 26 is a schematic view of a main portion of a fourteenth embodiment. In this embodiment, as in the twelfth embodiment, a test pattern (pinhole or linear slit) 15 is provided on a reticle 9. A first illumination light produced by the aperture stop 4c is projected to the pattern 15, by way of a lens 5, a beam splitter 16, and lenses 7 and 8. The image of the pattern is formed on a reflection plate 11i mounted on the wafer stage 12, through a projection optical system 10. The wafer stage 12 is moved, and the light reflected by the reflection plate 11i passes again through the projection optical system 10 and is imaged adjacent to the test pattern 15 of the reticle 9. The thus imaged light is transmitted through the test pattern 15, and it goes back along its oncoming path. Through the beam splitter 16 provided in the illumination system, the light is received by a photoreceptor 17, which may comprise a light intensity detector or a light quantity detector, for example.

Figure 27:
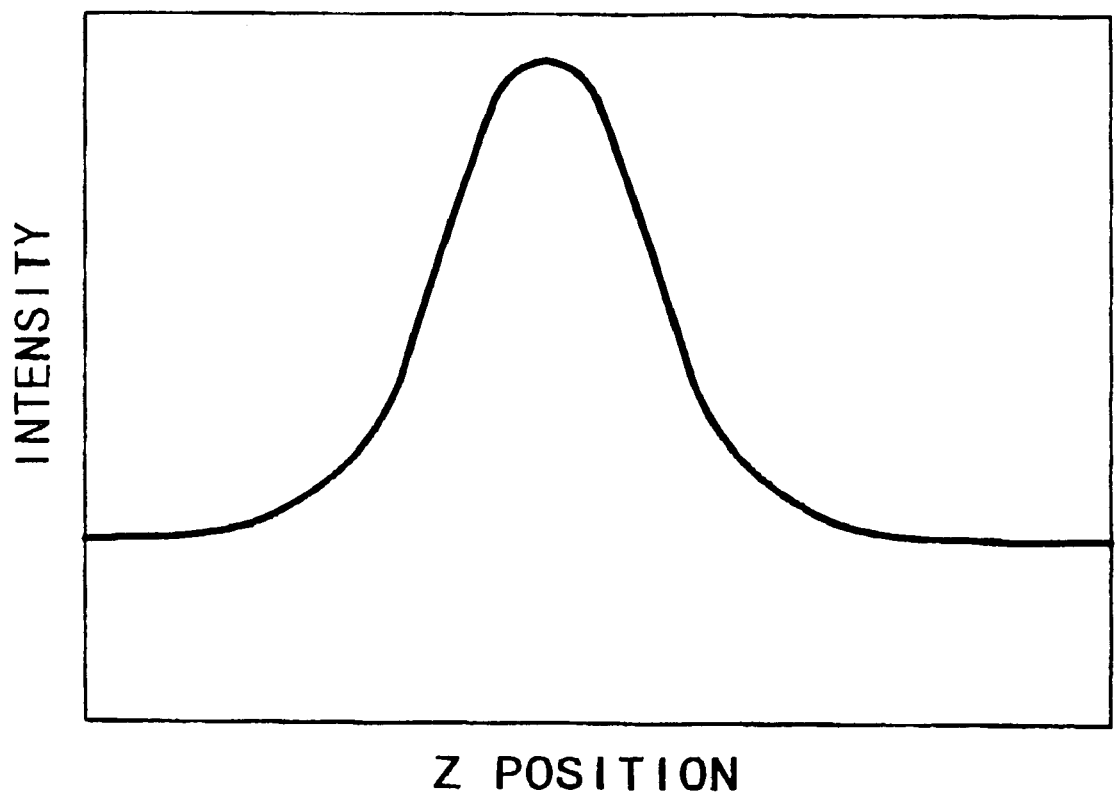
FIG. 27 is a graph for explaining the light intensity distribution of an aerial image.

The amount of lateral deviation of the test pattern 15 due to the defocus is twice larger than that of the twelfth embodiment or thirteenth embodiment, where the reduction magnification of the projection system 10 is 1. Also, at the best focus position, the lateral deviation is zero, and the intensity or quantity of light passing through the test pattern 15 is largest (smallest in the case of a light blocking pattern). Therefore, changes of the detector 17 have a peak with respect to the Z position of the reflection plate 11, as shown in FIG. 27. The stage 12 is moved in the optical axis direction (Z direction) of the projection optical system 10, and the reflection plate 11i is moved in the Z direction in synchronism with the Z position, the light intensity or light quantity at the detector 17 is detected. On the basis of the relation between the Z position and the light intensity or quantity such as shown in FIG. 27, a quadratic approximation operation is carried out, whereby the Z position which represents the peak is determined.

With the procedure described above, like the twelfth and thirteenth embodiments, the best focus position is detected.

A plurality of test patterns may be provided at different locations on one and the same reticle. On that occasion, like the twelfth embodiment, the image plane can be detected and, similarly, astigmatism can be measured by rotation of the aperture stop about the optical axis, by 90 deg. Further, automatic correction of them is attainable.

Next, an embodiment of a device manufacturing method which uses a projection exposure apparatus such as described above, will be explained.

Figure 28:
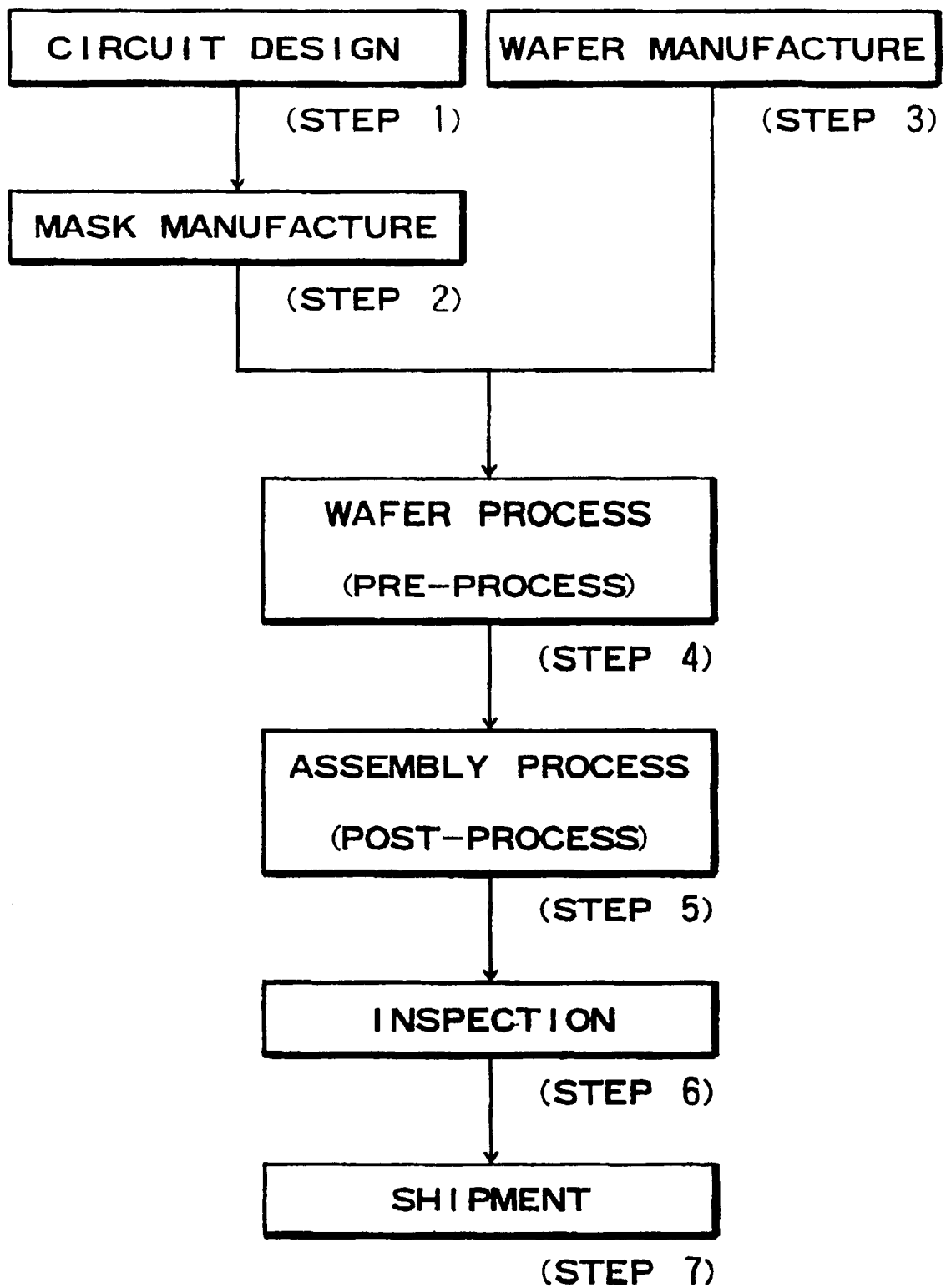
FIG. 28 is a flow chart of microdevice manufacturing processes.

FIG. 28 is a flow chart of a procedure for the manufacture of microdevices such as semiconductor chips (e.g., ICs or LSIs), liquid crystal panels, CCDs, thin film magnetic heads or micro-machines, for example.

Step 1 is a design process br designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 29:
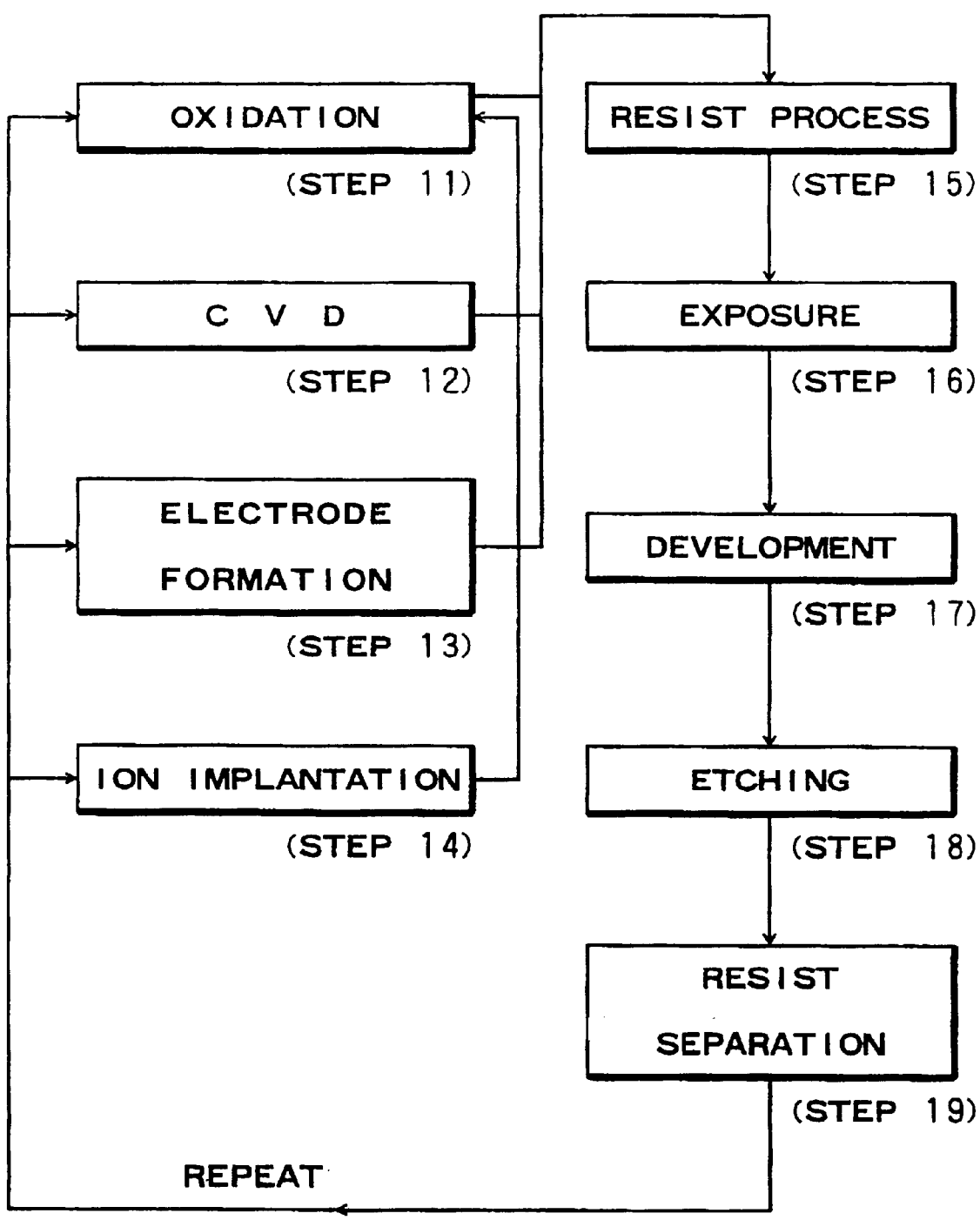
FIG. 29 is a flow chart for explaining details of a wafer process in the procedure shown in FIG. 28.

FIG. 29 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured

As described hereinbefore, the mark projection is carried out through an optical system and by using illumination lights having different chief ray incidence directions. This accomplishes superposition of mark images formed by these illuminations, approximately upon the imaging plane. On the basis of information related to the deviation between the superposed mark images, the focus information about the optical system is obtained. As a result, focus information being quantized conveniently can be produced with a higher measurement precision.

Further, a plurality of marks may be prepared in accordance with different image height positions, and the mark projection may be done in accordance with the different image height positions, by using an optical system and illumination lights having different chief ray incidence directions. Mark images are formed by these illuminations, approximately on the imaging plane. On the basis of the relative positional information about these mark images, focus information at each image height position of the optical system is obtained, and based on it, the image plane is measured. With this structure, image plane information being conveniently quantized is obtained with a higher measurement precision.

On the other hand, a transparent substrate has plural marks formed on one face thereof as well as a light blocking portion and an opening defined at the opposite surface thereof. For the mark projection through the optical system, at least two marks and the opening are so disposed that the at least two marks are illuminated with illumination lights having different chief ray incidence directions. With this arrangement, a projected image based on illumination from a particular direction necessary for the measurement of the projection optical system can be produced basically by use of the mask only.

Furthermore, the mark projection is carried out by use of an optical system and illumination lights having different chief ray incidence directions. From information related to the deviation of mark images formed approximately on the imaging plane, astigmatism of a projection optical system can be measured quickly and very precisely.

While the invention has been described with reference to the structures disclosed herein, it is not confined to the details set forth and this application is intended to cover such modifications or changes as may come within the purposes of the improvements or the scope of the following claims.

What is claimed is:

1. A method of detecting focus information about an image projecting optical system, said method comprising the steps of:

performing mark projection through the optical system and based on illumination lights having different chief ray incidence directions, the mark projection being carried out so that mark images formed by the illumination lights, respectively, are superposed one upon another approximately upon an imaging plane; and detecting focus information about the optical system on the basis of information related to a deviation between the mark images superposed.

2. A method according to claim 1, wherein the superposition of the mark images is carried out by sequential mark projections on a photosensitive material, on the basis of the illumination lights having different chief ray incidence directions.

3. A method according to claim 2, wherein the information about the deviation of the mark images is measured after development of the photosensitive material.

4. A method according to claim 2, wherein marks to be superposed have different overall sizes.

5. A method according to claim 1, wherein the illumination lights having different chief ray incidence angles are produced by changing an aperture shape of an aperture stop inside an illumination optical system or by changing the position of the aperture stop.

6. A method according to claim 5, wherein aperture stops are provided at positions axially symmetrical with respect to an optical axis of the illumination optical system.

7. A method according to claim 6, wherein the aperture stops are provided on a pupil plane where tilt of a wavefront of illumination light is flat.

8. A method according to claim 1, wherein the mark is provided on a transparent substrate, and wherein illumination light having a different chief ray incidence direction is produced by means of a disposition of an opening, defined in a light blocking area on a surface opposite to a mark bearing surface of the transparent substrate.

9. A method according to claim 1, further comprising determining an offset on the basis of a deviation of the superposed mark images as defined by illumination lights with the same illumination condition.

10. A method according to claim 1, wherein the mark image superposition is carried out under different conditions in which a focus state is changed, and wherein the focus information of the optical system is detected on the basis of a change in deviation between the mark images under the different conditions.

11. A method according to claim 10, wherein a best focus position is detected on the basis of linear approximation made to changes of deviation between the mark images.

12. A method according to claim 10, wherein one of the mark projection processes is carried out by illuminating plural marks, to be projected at different positions, with illumination lights having different chief ray tilts, and wherein, through the other mark projection process, marks are projected superposedly on the marks already projected on the different positions.

13. A method according to claim 1, wherein marks to be projected are provided at different image height positions, and wherein an image plane of the optical system is measured on the basis of deviation information related to these image heights.

14. A method according to claim 1, wherein a mark image by the mark projection is received by a light receiving element.

15. An exposure apparatus, comprising:
a projection optical system for projecting a reticle pattern onto a photosensitive substrate; and
measuring means for measuring a best focus position of said projection optical system, said measuring means having a function for detecting focus information about said optical system on the basis of information related to a deviation between mark images produced by mark projection made through said projection optical system and being based on illumination lights having different chief ray incidence directions,
wherein the mark projection is carried out so that mark images based on the illumination lights are superposed one upon another approximately on an imaging plane.

16. An apparatus according to claim 15, wherein said measuring means has a function for measuring an image plane of a projection optical system for projecting a reticle pattern onto a photosensitive substrate.

17. An apparatus according to claim 16, wherein said measuring means has a function for correcting an autofocus offset of a projection optical system for projecting a reticle pattern onto a photosensitive substrate.

18. A device manufacturing method, comprising the steps of:
performing mark projection through a projection optical system for projecting a reticle pattern onto a photosensitive substrate, and being based on illumination lights having different chief ray incidence directions, the mark projection being carried out so that mark images formed by the illumination lights, respectively, are superposed on upon another approximately upon an imaging plane;
detecting focus information about the optical system on the basis of information related to a deviation between the mark images superposed;
adjusting the projection optical system;
projecting the pattern onto the photosensitive substrate through the adjusted projection optical system; and
developing the photosensitive substrate, for formation of a circuit on the substrate.

19. A method of measuring an image plane of an image projection optical system, said method comprising the steps of:
preparing plural marks in accordance with different image heights;
performing mark projection in relation to each of the different image heights, made through the optical system and on the basis of illumination lights having different chief ray incidence angles; and
detecting focus information of the optical system in relation to each of the different image heights, on the basis of information about a relative position between mark images as produced by the illumination lights,
wherein the image plane measurement is performed on the basis of the focus information related to the different image heights.

20. A method according to claim 19, wherein the mark image formation is carried out by performing sequential mark projections on a photosensitive material, on the basis of the illumination lights having different chief ray incidence directions.

21. A method according to claim 20, wherein the information about the relative position of the mark images is measured after development of the photosensitive material.

22. An exposure apparatus, comprising:
a projection optical system for projecting a reticle pattern onto a photosensitive substrate; and
measuring means for measuring an image plane of said projection optical system, said measuring means having a function for detecting focus information about said optical system, in relation to each of different image height positions, on the basis of information related to a relative position of mark images produced by mark projection made through said projection optical system and being based on illumination lights having difference chief ray incidence directions.

23. An apparatus according to claim 22, wherein said measuring means has a function for correcting an autofocus offset of a projection optical system.

24. A mask to be used in measurement for an image projecting optical system, said mask comprising:
a transparent substrate;
a plurality of marks provided on a surface of the substrate; and
a light blocking portion and an opening portion formed on a surface opposite to a mark bearing surface of the substrate,
wherein at least two marks and the opening portion are disposed so that, for projection of the marks through the optical system, the at least two marks are illuminated with illumination lights having different chief ray incidence angles.

25. A mask according to claim 24, wherein there are plural sets defined with each set comprising the two marks and an opening corresponding to the two marks, wherein the plural sets are provided in relation to different image height portions.

26. A mask according to claim 24, further comprising two marks provided separately in relation to the two marks, at positions on the opposite surface where there is no light blocking area formed.

27. A method of measuring astigmatism of a projection optical system, said method comprising the steps of:
performing mark projection through the optical system and based on illumination light having different chief ray incidence directions; and
detecting information about a deviation between mark images produced approximately on an imaging plane by the mark projection, wherein information related to the astigmatism of the optical system is detected on the basis of the deviation information.

28. A method according to claim 27, wherein the astigmatism of the optical system is detected on the basis of deviation information related to a deviation component in a direction independent from a focus state of the mark images.

29. A method according to claim 27, wherein the astigmatism of the optical system is detected on the basis of deviation information of the mark images, related to a direction perpendicular to a plane defined by chief rays of illumination lights having different incidence directions.

30. A method according to claim 27, wherein the mark projection based on the illumination lights having different chief ray incidence directions is carried out by illuminating different marks with illumination lights having different incidence directions and by superposing the mark images one upon another approximately on an imaging plane.

31. A method according to claim 30, wherein the superposition of the mark images is carried out by sequential mark projections on a photosensitive material, on the basis of the illumination lights having different chief ray incidence directions.

32. A method according to claim 30, wherein marks to be superposed have different overall sizes.

33. A method according to claim 30, wherein marks to be superposed are disposed at different positions in a direction perpendicular to an optical axis direction of the optical system.

34. A method according to claim 33, wherein the marks are disposed at different positions along a circumferential direction at least about the optical axis.

35. A method according to claim 27, wherein a plurality of sets of illumination lights having different chief ray incidence directions are prepared, which are to be used for the mark deviation measurement.

36. A method according to claim 27, wherein the illumination lights having different chief ray incidence directions are produced by changing the disposition of a stop inside an illumination optical system for supplying the illumination light.

37. A method according to claim 27, wherein the mark image defined by the mark projection is detected by use of a light receiving element.

38. An exposure apparatus, comprising:
a projection optical system for projecting a reticle pattern onto a photosensitive substrate; and
measuring means for measuring astigmatism of said projection optical system, said measuring means having a function for detecting information related to a deviation of mark images produced approximately on an imaging plane, by mark projection made through said projection optical system and being based on illumination lights having difference chief ray incidence directions.

39. A device manufacturing method, comprising the steps of:
performing mark projection through a projection optical system for projecting a reticle pattern onto a photosensitive substrate, and being based on illumination lights having different chief ray incidence directions;
detection information about a deviation of mark images to be produced approximately on an imaging plane, by the mark projection, wherein information related to the astigmatism of the optical system is detected on the basis of the deviation information;
adjusting the optical system, on the basis of the astigmatism information;
projecting the pattern onto the photosensitive substrate through the adjusted projection optical system; and
developing the photosensitive substrate, for formation of a circuit on the substrate.

40. An apparatus according to claim 15, wherein said measuring means performs the image detection on the basis of the deviation information of the mark images and by use of a light receiving system.

41. An apparatus according to claim 40, wherein said light receiving system includes a plate provided at or adjacent to a position where an image is formed, a slit formed in the plate, and a photoreceptor for detecting light passing through the slit, and wherein, for the image detection, said light receiving system is moved in a direction perpendicular to an optical axis of said projection optical system.

42. An apparatus according to claim 40, further comprising a plate provided at or adjacent to a position where an image is formed, a slit formed in the plane, and a photoreceptor for detecting light passing through the slit, wherein, for the image detection, said light receiving system is moved in a direction perpendicular to an optical axis of said projection optical system.

43. An apparatus according to claim 22, wherein said measuring means performs the image detection on the basis of the deviation information of the mark images and by use of a light receiving system.

44. An apparatus according to claim 43, wherein said light receiving system includes a plate provided at or adjacent to a position where an image is formed, a slit formed in the plate, and a photoreceptor for detecting light passing through the slit, and wherein, for the image detection, said light receiving system is moved in a direction perpendicular to an optical axis of said projection optical system.

45. An apparatus according to claim 43, further comprising a plate provided at or adjacent to a position where an image is formed, a slit formed in the plate, and a photoreceptor for detecting light passing through the slit, wherein, for the image detection, said light receiving system is moved in a direction perpendicular to an optical axis of said projection optical system.

46. An apparatus according to claim 38, wherein said measuring means performs the image detection on the basis of the deviation information of the mark images and by use of a light receiving system.

47. An apparatus according to claim 46, wherein said light receiving system includes a plate provided at or adjacent to a position where an image is formed, a slit formed in the plate, and a photoreceptor for detecting light passing through the slit, and wherein, for the image detection, said light receiving system is moved in a direction perpendicular to an optical axis of said projection optical system.

48. An apparatus according to claim 46, further comprising a plate provided at or adjacent to a position where an image is formed, a slit formed in the plate, and a photoreceptor for detecting light passing through the slit, wherein, for the image detection, said light receiving system is moved in a direction perpendicular to an optical axis of said projection optical system.

* * * * *

UNITED STATES PATENT AND TRADEMARK OFFICE
CERTIFICATE OF CORRECTION

PATENT NO. : 6,633,390 B2
DATED : October 14, 2003
INVENTOR(S) : Yoshihiro Shiode et al.

It is certified that error appears in the above-identified patent and that said Letters Patent is hereby corrected as shown below:

Drawings,
Sheet 4, Figure 6, in the boxes labeled "609," and "611," "CALUCULATE" should read -- CALCULATE -- .
Sheet 11, Figure 12A, in the diamond-shaped box labeled "1207," "AFRAME" should read -- FRAME --.
Sheet 13, Figure 13A, in the diamond-shaped box labeled "1307," "AFRAME" should read -- FRAME --
Sheet 17, Figure 17, in the box labeled "1702," "MALK" should read -- MARK --.
Sheet 20, Figure 20, in the box labeled "2001," "MALK" should read -- MARK --.

Column 4,
Line 36, "set" should read -- set. --.

Column 8,
Line 3, "$e(924R^{12} - 2772R^{10} + 3150R^8 - 1680R^6 + 420R^4 +$" should read -- $e(924R^{12} - 2772R^{10} + 3150R^8 - 1680R^6 + 420R^4 -$ --.

Column 11,
Line 4, "shot" should read -- shot, --.

Column 12,
Line 40, "process" should be deleted.
Line 44, "proces" should read -- process --.

Column 13,
Line 28, "heights." should read -- height. --.

Column 15,
Line 49, "itselfs" should read -- itself, --.

Column 16,
Line 56, "if" should read -- of --.

Column 19,
Line 14, "$\Delta S(\theta, R) = A(R) \star \cos 2\theta - B(R) \star sin2\theta + C(R) \star \cos 4\theta - D(R) \star \sin 4\theta$" should read -- $\Delta S(\theta, R) = A(R) \star \cos 2\theta - B(R) \star \sin 2\theta + C(R) \star \cos 4\theta - D(R) \star \sin 4\theta$ --

Line 29, "$\Delta S(\pi/8, R0) = 1/\sqrt{2 * A(R0)} - 1\sqrt{\sqrt{2 * B(R0) - D(R0)}}$" should read -- $\Delta S(\pi/8, R0) = 1/\sqrt{2 * A(R0)} - 1/\sqrt{2 * B(R0) - D(R0)}$ --.

UNITED STATES PATENT AND TRADEMARK OFFICE
CERTIFICATE OF CORRECTION

PATENT NO. : 6,633,390 B2
DATED : October 14, 2003
INVENTOR(S) : Yoshihiro Shiode et al.

It is certified that error appears in the above-identified patent and that said Letters Patent is hereby corrected as shown below:

Column 22,
Line 39, "2005;" should read -- 2005: --.
Line 57, "omitted However," should read -- omitted. However, --.

Column 27,
Line 3, "Z direction in" should read -- Z direction. In --.
Line 61, "manufactured" should read -- manufactured. --.

Column 30,
Line 46, "difference" should read -- different --.

Column 32,
Line 27, "plane," should read -- plate, --.

Signed and Sealed this

Thirteenth Day of July, 2004

JON W. DUDAS
*Acting Director of the United States Patent and Trademark Office*